(12) United States Patent
Itoh

(10) Patent No.: US 12,141,407 B2
(45) Date of Patent: Nov. 12, 2024

(54) CONDUCTIVE FILM

(71) Applicant: FUJIFILM Corporation, Tokyo (JP)

(72) Inventor: Shigehide Itoh, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 19 days.

(21) Appl. No.: 18/327,731

(22) Filed: Jun. 1, 2023

(65) Prior Publication Data

US 2024/0004504 A1  Jan. 4, 2024

(30) Foreign Application Priority Data

Jun. 30, 2022 (JP) ................................. 2022-105745

(51) Int. Cl.
| | | |
|---|---|---|
| *H05K 9/00* | (2006.01) | |
| *G06F 3/041* | (2006.01) | |
| *G06F 3/044* | (2006.01) | |

(52) U.S. Cl.
CPC .......... *G06F 3/0446* (2019.05); *G06F 3/0412* (2013.01); *G06F 3/0445* (2019.05); *H05K 9/0094* (2013.01); *G06F 2203/04112* (2013.01)

(58) Field of Classification Search
CPC .................................................. H05K 9/0094
See application file for complete search history.

(56) References Cited

U.S. PATENT DOCUMENTS

| | | | | |
|---|---|---|---|---|
| 2016/0081184 A1* | 3/2016 | Katagiri | ................. | H10K 71/60 |
| | | | | 174/268 |
| 2019/0179453 A1* | 6/2019 | Hattori | ...................... | H01B 5/14 |
| 2020/0249782 A1* | 8/2020 | Nakayama | ............ | G06F 3/0446 |
| 2021/0389834 A1* | 12/2021 | Inoue | ...................... | B32B 7/025 |
| 2022/0113837 A1* | 4/2022 | Kamijo | ................. | G06F 3/0446 |
| 2023/0229276 A1* | 7/2023 | Suzuki | ................. | G06F 3/0446 |
| | | | | 345/174 |
| 2023/0409150 A1* | 12/2023 | Kato | ....................... | G06F 3/041 |

FOREIGN PATENT DOCUMENTS

JP         2015-133256 A        7/2015

* cited by examiner

*Primary Examiner* — Hung V Ngo
(74) *Attorney, Agent, or Firm* — Edwards Neils LLC; Jean C. Edwards, Esq.

(57) ABSTRACT

Provided is a conductive film in which wire visibility of a metal wire is suppressed and visibility is improved. The conductive film includes a substrate and a conductive layer that is disposed on the substrate and consists of a metal wire, with a width of 2 μm or less, a height of 1 μm or less, and the metal wire has a metal layer, a first blackening layer, and a second blackening layer in this order from a side of the substrate. The first and second blackening layers contain a metal atom and at least one selected from the group consisting of an oxygen atom and a nitrogen atom. In the first blackening layer, a content of the metal atom at an intermediate position in a thickness direction is larger than a content of the metal atom at an intermediate position in the second blackening layer in a thickness direction.

16 Claims, 7 Drawing Sheets

CONDUCTIVE FILM

CROSS-REFERENCE TO RELATED APPLICATIONS

The present application claims priority under 35 U.S.C. § 119 to Japanese Patent Application No. 2022-105745, filed on Jun. 30, 2022. The above application is hereby expressly incorporated by reference, in its entirety, into the present application.

BACKGROUND OF THE INVENTION

1. Field of the Invention

The present invention relates to a touch panel that is used in a conductive film or the like.

2. Description of the Related Art

Among various electronic apparatuses including portable information apparatus such as a tablet computer and a smartphone, there is a touch panel which is used in combination with a display device such as a liquid crystal display device and with which an input operation to an electronic apparatus is carried out by touching a screen or bringing a finger, a stylus pen, or the like close to a screen.

In the touch panel, a conductive film on which a plurality of detection electrodes and the like for detecting a touch operation with a finger, a stylus pen, or the like is formed is generally used as the touch sensor. The detection electrode of the conductive film is formed from a transparent conductive oxide such as indium tin oxide (ITO), a metal, or the like. As compared with a transparent conductive oxide, a metal has advantages such as easy patterning, excellent flexibility, and a lower electric resistance value. For this reason, in the conductive film, a metal such as copper or silver is used in a metal wire that constitutes the detection electrode.

For example, JP2015-133256A describes a manufacturing method for a transparent conductive laminate in which copper oxide and copper are sequentially formed as thin films on at least one surface of a transparent film base material, having conductive patterns formed of copper oxide and copper, respectively, with a line width of 1 to 10 μm. Here, a copper oxide film and a copper film are formed by using a sputtering method.

SUMMARY OF THE INVENTION

In a case where the transparent conductive laminate of JP2015-133256A, in which a copper oxide film and a copper film are laminated, is used in a touch sensor of a touch panel, a portion of the copper film of the conductive pattern is easily visible to a user of the touch panel, and thus the visibility is bad. The conductive pattern of JP2015-133256A corresponds to the metal wire described above, and the transparent conductive laminate corresponds to the conductive film.

The phenomenon in which a conductive pattern is visible to a user may be referred to as "wire visibility".

From the viewpoint of visibility of a touch sensor, it is desired that the wire visibility of the metal wire of the conductive film is suppressed since it is desired that the metal wire of the conductive film is not visible.

An object of the present invention is to provide a conductive film in which the wire visibility of the metal wire is suppressed and visibility is improved.

In order to achieve the above-described object, an invention [1] provides a conductive film comprising:
 a substrate; and
 a conductive layer that is disposed on the substrate and consists of a metal wire,
 in which a width of the metal wire is 2 μm or less, and a height of the metal wire is 1 μm or less,
 the metal wire has a metal layer, a first blackening layer, and a second blackening layer in this order from a side of the substrate,
 the first blackening layer and the second blackening layer are layers containing a metal atom and at least one selected from the group consisting of an oxygen atom and a nitrogen atom, and
 in the first blackening layer, a content of the metal atom at an intermediate position in the first blackening layer in a thickness direction is larger than a content of the metal atom at an intermediate position in the second blackening layer in a thickness direction.

An invention [2] provides the conductive film according to the invention [1], further comprising a third blackening layer that is disposed on a side surface of the metal layer, in which the third blackening layer is a layer containing a metal atom and at least one selected from the group consisting of an oxygen atom and a nitrogen atom.

An invention [3] provides the conductive film according to the invention [1] or the invention [2], in which a thickness of the second blackening layer is larger than a thickness of the first blackening layer.

An invention [4] provides the conductive film according to any one of the invention [1] to the invention [3], in which a thickness of the second blackening layer is 10 to 50 nm.

An invention [5] provides the conductive film according to any one of the invention [1] to the invention [4], in which the metal atom includes Cu.

According to the present invention, it is possible to provide a conductive film that suppresses wire visibility of a metal wire and has good visibility.

DESCRIPTION OF THE PREFERRED EMBODIMENTS

Hereinafter, a conductive film according to the embodiment of the present invention will be described in detail based on suitable embodiments illustrated in the attached drawings.

The figures described below are exemplary for explaining the present invention, and the present invention is not limited to the figures illustrated below.

In the following, "to" indicating a numerical range includes numerical values described on both sides thereof. For example, in a case where ε is a numerical value $\varepsilon_\alpha$ to a numerical value $\varepsilon_\beta$, the range of ε is a range including the numerical value $\varepsilon_\alpha$ and the numerical value $\varepsilon_\beta$, and thus it is $\varepsilon_\alpha \leq \varepsilon \leq \varepsilon_\beta$ in a case of being described with mathematical symbols.

In the description of an angle such as "parallel" and "orthogonal", the angle includes an error range generally allowed in the related art unless otherwise specified.

The "transparency" refers to that the light transmittance is 40% or more in a visible light wavelength range of a wavelength range of 380 to 780 nm, unless otherwise specified, where the light transmittance is preferably 80% or more and more preferably 90% or more.

The light transmittance is measured using "Plastics—Determination of total luminous transmittance and reflectance" specified in Japanese Industrial Standards (JIS) K 7375: 2008.

In addition, insulation means electrical insulation unless otherwise specified. The insulating substrate is a substrate having electrical insulating properties and has electric resistance according to a use application to be applied. For example, in a case where conductive wires are formed on both surfaces of an insulating substrate, respectively, the conductive wires formed on both surfaces are not conducted with each other.

First Example of Image Display Apparatus

Figure 1:
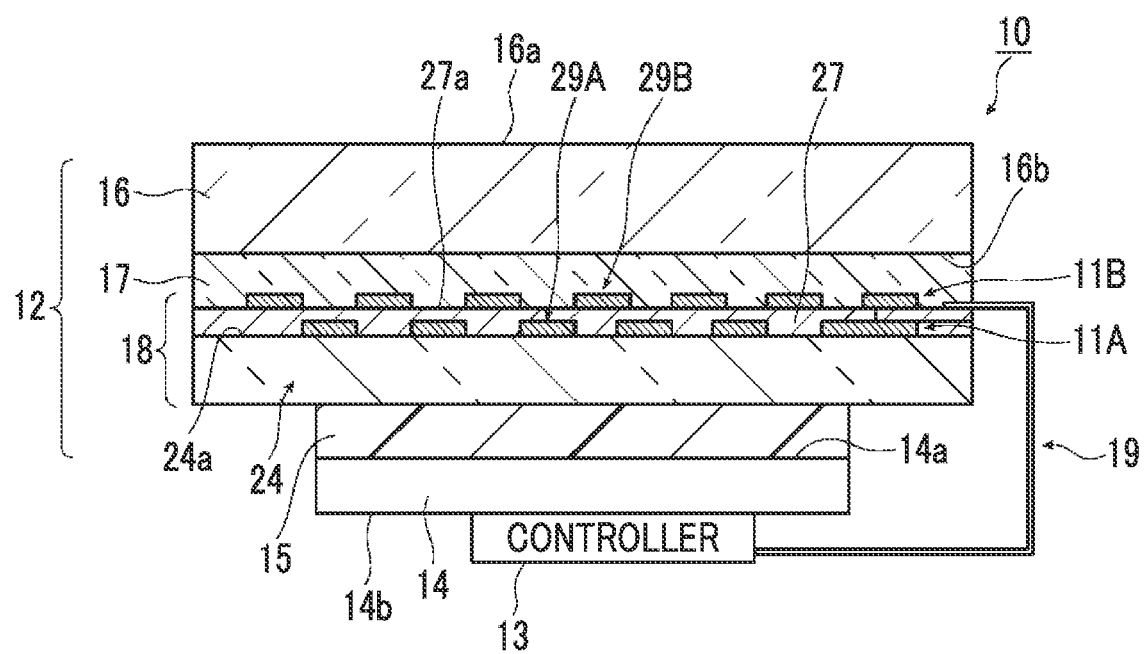
FIG. 1 is a schematic cross-sectional view illustrating a first example of an image display apparatus having a conductive film according to an embodiment of the present invention.

FIG. 1 is a schematic cross-sectional view illustrating a first example of an image display apparatus having a conductive film according to an embodiment of the present invention.

An image display apparatus 10 of the first example illustrated in FIG. 1 has a touch panel 12 and an image display unit 14, where the touch panel 12 is laminated on a side of a display surface 14a of the image display unit 14.

The image display apparatus 10 can detect that a region such as an image displayed on the image display unit 14 is touched.

In the image display apparatus 10, the touch panel 12 and the image display unit 14 are laminated with a first transparent insulation layer 15 being sandwiched therebetween. In the touch panel 12, a cover layer 16 is provided on a conductive film 18 with a second transparent insulation layer 17 being sandwiched therebetween. A first transparent insulation layer 15 is provided on an entire region of the display surface 14a of the image display unit 14. For example, in a case of being viewed from a side of a surface 16a of the cover layer 16, the conductive film 18 and the second transparent insulation layer 17 have the same size. In addition, in a case of being viewed from the side of the surface 16a of the cover layer 16, the image display unit 14 is smaller than the conductive film 18, and the image display unit 14 and the first transparent insulation layer 15 have the same size.

In the image display apparatus 10, it is preferable that the first transparent insulation layer 15 disposed on the side of the display surface 14a of the image display unit 14 the conductive film 18, the second transparent insulation layer 17, and the cover layer 16 are all transparent so that a display object (not illustrated in the drawing) displayed on the display surface 14a of the image display unit 14 can be visible.

In a case where the cover layer 16 is composed of glass, it is called a cover glass.

The surface 16a of the cover layer 16 is a touch surface of the image display apparatus 10 and serves as an operation surface. The image display apparatus 10 is subjected to an input operation using the surface 16a of the cover layer 16 as an operation surface. It is noted that the touch surface is a surface with which a finger, a stylus pen, or the like comes into contact. The surface 16a of the cover layer 16 serves as a visible surface of a display object (not illustrated in the drawing) displayed on the display surface 14a of the image display unit 14.

A controller 13 is provided on a back surface 14b of the image display unit 14. The conductive film 18 and the controller 13 are electrically connected by, for example, a flexible wiring member such as a flexible circuit board 19.

A decorative layer (not illustrated in the drawing) having a light shielding function may be provided on the back surface 16b of the cover layer 16. The decorative layer is provided along the outer edge of the cover layer 16, for example, in a case of being viewed from the side of the surface 16a of the cover layer 16. The region where the decorative layer is provided is called a frame part. The decorative layer of the frame part causes configuration components not to be visible, where the configuration components are those present under the lower side of the frame part, for example, electrode terminals and peripheral wires of the conductive film 18, which will be described later.

The controller 13 is composed of known ones that are used for detecting contact with a finger or the like on the surface 16a of the cover layer 16 that serves as a touch surface. In a case where the touch panel 12 belongs to the capacitance type, the controller 13 detects a position where the capacitance is changed in the conductive film 18 by contact with a finger or the like of the surface 16a of the cover layer 16 which serves as a touch surface. Although the capacitance type touch panel includes a mutual capacitance type touch panel and a self-capacitance type touch panel, it is not particularly limited.

The cover layer 16 is a cover layer that protects the conductive film 18. The configuration of the cover layer 16 is not particularly limited. The cover layer 16 is preferably transparent so that a display object (not illustrated in the drawing) displayed on the display surface 14a of the image display unit 14 can be visible. The cover layer 16 is composed of, for example, a glass plate, chemically reinforced glass, non-alkali glass, or the like. It is preferable that the thickness of the cover layer 16 is appropriately selected according to each use application. As the cover layer 16, a plastic film, a plastic plate, or the like is used in addition to the glass plate.

As raw materials of the above-described plastic film and plastic plate, the following materials can be used, for example, polyesters such as polyethylene terephthalate (PET) and polyethylene naphthalate (PEN); polyolefin resins such as polyethylene (PE), polypropylene (PP), polystyrene, and vinyl acetate copolymerized polyethylene (EVA); vinyl resins; and other materials such as a polycarbonate (PC) resin, a polyamide resin, a polyimide resin, a (meth) acrylic resin, triacetyl cellulose (TAC), a cycloolefin-based resin (COP), polyvinylidene fluoride (PVDF), polyarylate (PAR), polyether sulfone (PES), a fluorene derivative, and crystalline COP.

It is noted that the (meth)acrylic resin is a general term including an acrylic resin and a methacrylic resin.

In addition, the cover layer 16 may be configured to have a polarizing plate, a circular polarizing plate, or the like.

Since the surface 16a of the cover layer 16 serves as a touch surface as described above, a hard coat layer may be provided on the surface 16a as necessary. The thickness of the cover layer 16 is, for example, 0.1 to 1.3 mm, and it is particularly preferably 0.1 to 0.7 mm.

The configuration of the first transparent insulation layer 15 is not particularly limited as long as it is transparent and has electrical insulating properties, and it can stably fix the touch panel 12 and the image display unit 14. As the first transparent insulation layer 15, it is possible to use, for example, an optical clear resin (OCR) such as an optical clear adhesive (OCA) or an ultra violet (UV) curing resin. In addition, the first transparent insulation layer 15 may be partially hollow.

It is noted that, instead of providing the first transparent insulation layer 15, a configuration in which a gap is provided on the display surface 14a of the image display unit 14 so that the touch panel 12 is spaced apart may be adopted. This gap is also referred to as an air gap.

In addition, the configuration of the second transparent insulation layer 17 is not particularly limited as long as it is transparent and has electrical insulating properties, and it can stably fix the conductive film 18 and the cover layer 16. As the second transparent insulation layer 17, the same one as the first transparent insulation layer 15 can be used.

The image display unit 14 is an image display unit that includes the display surface 14a for displaying a display object such as an image, and it is, for example, a liquid crystal display device. The image display unit 14 is not limited to the liquid crystal display device, and it may be an organic electro luminescence (organic EL) display device. In addition to the display device described above, it is possible to use, as the image display unit 14, a cathode ray tube (CRT) display device, a vacuum fluorescent display (VFD), a plasma display panel (PDP), a surface electric field display (SED), an electric field emission display (FED), and an electron paper, or the like.

An image display unit in response to the use application of the image display unit 14 can be appropriately used.

However, it is preferable that the image display unit 14 has a form of a panel such as a liquid crystal display panel or an organic EL panel so that the thickness of the image display apparatus 10 is configured to be thin.

Touch Panel

Hereinafter, the touch panel 12 will be described with reference to FIG. 1 and FIG. 2.

Figure 2:
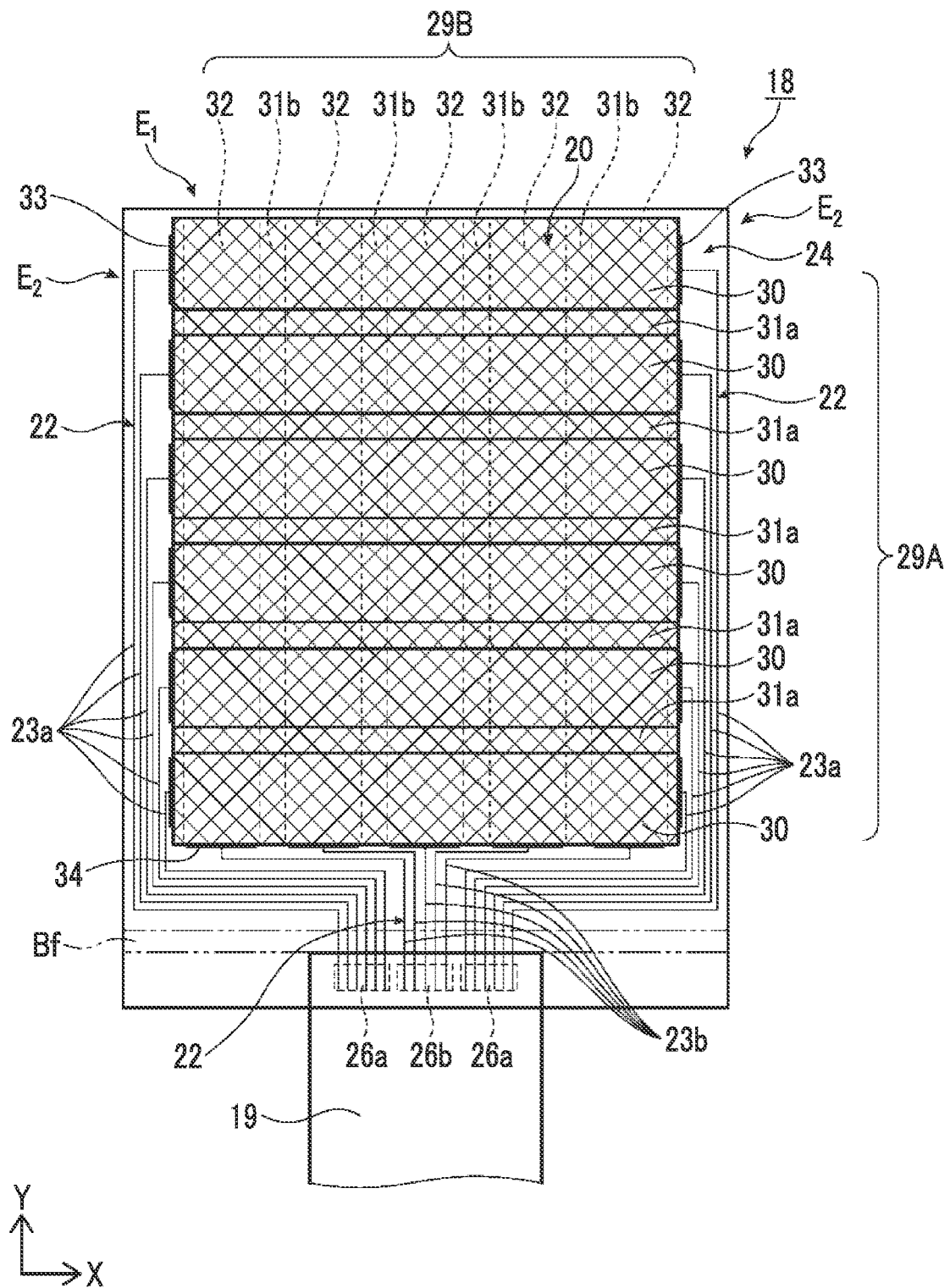
FIG. 2 is a schematic plan view illustrating the first example of the conductive film according to the embodiment of the present invention.

FIG. 2 is a schematic plan view illustrating one example of the conductive film according to the embodiment of the present invention. It is noted that in FIG. 2, the same reference numerals are assigned to the same configuration components as those in the image display apparatus 10 illustrated in FIG. 1, and the detailed description thereof will be omitted.

The touch panel 12 has the controller 13, the conductive film 18, and the cover layer 16. The conductive film 18 functions as a touch sensor.

The conductive film 18 has, for example, a substrate 24, a metal wire 35 (see FIG. 3) disposed on a surface 24a of the substrate 24, and a transparent insulation layer 27 (see FIG. 1) that coats the metal wire 35.

A first conductive layer 11A is provided on the surface 24a of the substrate 24, where the first conductive layer 11A has a first detection electrode layer 29A having a plurality of first detection electrodes 30 and a plurality of first peripheral wires 23a, in which one end is electrically connected to the first detection electrode 30 of the first detection electrode layer 29A and the other end is equipped with a first external connection terminal 26a. The first conductive layer 11A is coated with the transparent insulation layer 27.

Figure 3:
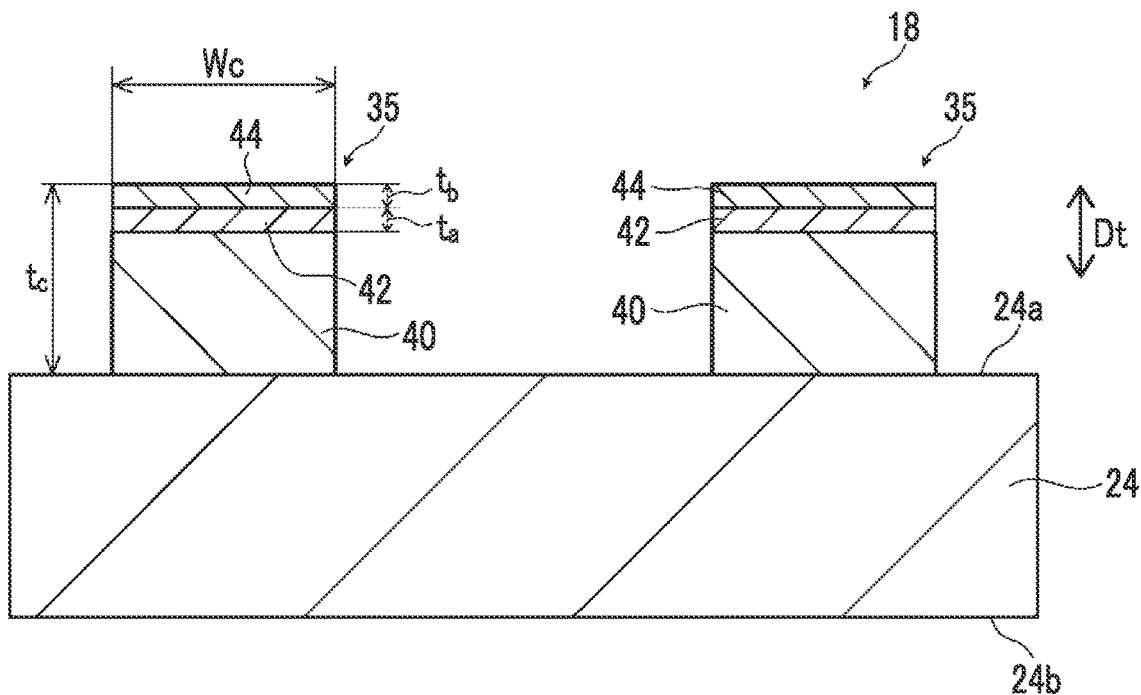
FIG. 3 is a schematic cross-sectional view illustrating the first example of the conductive film according to the embodiment of the present invention.

The first detection electrode 30 is composed of the metal wire 35 (see FIG. 3). The metal wire 35 that constitutes the first detection electrode 30 is referred to as a first metal wire. The first metal wire is disposed on the surface 24a of the substrate 24.

The flexible circuit board 19 is electrically connected to the first external connection terminal 26a and is connected to the controller 13.

In addition, the metal wire 35 is further disposed on the transparent insulation layer 27. The second detection electrode 32 is composed of the metal wire 35.

A second conductive layer 11B is provided on the transparent insulation layer 27, where the second conductive layer 11B has a second detection electrode layer 29B having a plurality of second detection electrodes 32 and a plurality of second peripheral wires 23b, in which one end is electrically connected to the second detection electrode 32 and the other end is equipped with a second external connection terminal 26b. Similar to the first conductive layer 11A, the flexible circuit board 19 is electrically connected to the second external connection terminal 26b and is connected to the controller 13.

The second detection electrode 32 is composed of the metal wire 35 (see FIG. 3). The metal wire 35 that constitutes the second detection electrode 32 is referred to as a second metal wire. The second metal wire is disposed on the transparent insulation layer 27. As described above, the metal wire 35 is referred to as the first metal wire in the first detection electrode 30, and the metal wire 35 is referred to as a second metal wire in the second detection electrode 32. The first metal wire and the second metal wire are collectively referred to as the metal wire 35. Unless otherwise specified, the metal wire 35 includes the first metal wire and the second metal wire.

Conductive Film

The conductive film 18 will be described with reference to FIG. 2 and FIG. 3. FIG. 3 is a schematic cross-sectional view illustrating a first example of the conductive film according to the embodiment of the present invention. It is noted that in FIG. 3, the same reference numerals are assigned to the same configuration components as those in the image display apparatus 10 illustrated in FIG. 1, and the detailed description thereof will be omitted.

The conductive film 18 illustrated in FIG. 2 is a portion that functions as a touch sensor of a touch panel 12, and it has a detection unit 20 that is a detection region $E_1$ where a user can carry out an input operation, and a peripheral wiring part 22 in a peripheral region $E_2$ that is located on the outside of the detection region $E_1$.

The detection unit 20 has, for example, a first detection electrode layer 29A and a second detection electrode layer 29B. The first detection electrode layer 29A and the second detection electrode layer 29B are disposed, for example, with the transparent insulation layer 27 being sandwiched therebetween. The first detection electrode layer 29A and the second detection electrode layer 29B are electrically insulated by the transparent insulation layer 27. The transparent insulation layer 27 functions as an electrical insulating layer.

The first detection electrode layer 29A has a plurality of the first detection electrodes 30 and a plurality of first dummy electrodes 31a that are disposed between the adjacent first detection electrodes 30 and insulated from the first detection electrodes 30.

The plurality of first detection electrodes 30 are strip-shaped electrodes that extend in the X direction in parallel with each other and are provided on the surface 24a of the substrate 24 (see FIG. 1) in a state of being spaced apart from each other in the Y direction orthogonal to the X direction and being electrically insulated from each other in the Y direction. In addition, the plurality of first dummy electrodes 31a are disposed between the first detection electrodes 30 and are provided on the surface 24a of the substrate 24 (see FIG. 1) in a state of being electrically insulated from the first detection electrodes 30. A first electrode terminal 33 is provided at least one end of each of the first detection electrodes 30 in the X direction.

The second detection electrode layer 29B has a plurality of second detection electrodes 32 and a plurality of second dummy electrodes 31b that are disposed between the adjacent second detection electrodes 32 and insulated from the second detection electrodes 32. The plurality of second detection electrodes 32 are strip-shaped electrodes that extend in the Y direction in parallel with each other and are provided on the surface 27a of the transparent insulation layer 27 (see FIG. 1) in a state of being spaced apart from each other in the X direction and being electrically insulated from each other in the X direction. In addition, the plurality of second dummy electrodes 31b are disposed between the second detection electrodes 32 and are provided on the surface 27a of the transparent insulation layer 27 (see FIG. 1) in a state of being electrically insulated from the second detection electrodes 32. A second electrode terminal 34 is provided at one end of each of the second detection electrodes 32 in the Y direction.

The plurality of first detection electrodes 30 and the plurality of second detection electrodes 32 are provided orthogonally to each other; however, they are electrically insulated from each other by the transparent insulation layer 27 as described above.

The first dummy electrode 31a and the second dummy electrode 31b in the first detection electrode 30 and the second detection electrode 32 are separated from the first detection electrode 30 or the second detection electrode 32 by a disconnection portion, and they are regions which are not electrically connected. As a result, as described above, the plurality of first detection electrodes 30 are in a state of being electrically insulated from each other in the Y direction, and the plurality of second detection electrodes 32 are in a state of being electrically insulated from each other in the X direction. As illustrated in FIG. 2, six first detection electrodes 30 and five second detection electrodes 32 are provided in the detection unit 20; however, the numbers thereof are not particularly limited as long as they are plural.

The first detection electrode layer 29A and the second detection electrode layer 29B are composed of the metal wire 35 (see FIG. 3) as described above. In a case where the first detection electrode 30 and the second detection electrode 32 are a metal mesh having a mesh pattern formed by the metal wire 35, the first dummy electrode 31a and the second dummy electrodes 31b are also a metal mesh having a mesh pattern formed by the metal wire 35.

The electrode width of the first detection electrode 30 and the electrode width of the second detection electrode 32 are, for example, 1 to 5 mm, and the pitch between the electrodes is 3 to 6 mm. The electrode width of the first detection electrode 30 is the maximum length in the Y direction, and the electrode width of the second detection electrode 32 is the maximum length in the X direction.

The peripheral wiring part 22 is a region where peripheral wires (a first peripheral wire 23a and a second peripheral wire 23b) that are wiring lines for transmitting or transferring a touch drive signal and a touch detection signal from a controller 13 to the first detection electrode 30 and the second detection electrode 32 are disposed. The peripheral wiring part 22 has a plurality of first peripheral wires 23a and a plurality of second peripheral wires 23b. One end of the first peripheral wire 23a is electrically connected to the first detection electrode 30 through the first electrode terminal 33, and the other end thereof is electrically connected to a first external connection terminal 26a. Further, one end of the second peripheral wire 23b is electrically connected to the second detection electrode 32 through the second electrode terminal 34, and the other end thereof is electrically connected to a second external connection terminal 26b.

The first electrode terminal 33 and the second electrode terminal 34 may have a fill pattern shape or a mesh shape as shown in JP2013-127658A. The preferred range of the widths of the first electrode terminal 33 and the second electrode terminal 34 is ⅓ times or more and 1.2 times or less with respect to each of the electrode widths of the first detection electrode 30 and the second detection electrode 32.

The first detection electrode 30, the first dummy electrode 31a, the first electrode terminal 33, and the first peripheral wire 23a of the first conductive layer 11A are preferably integrally constituted and still more preferably formed of the same metal material from the viewpoints of the electric resistance and the hardness in the occurrence of disconnection. In this case, the first conductive layer 11A is formed by, for example, a lithography method.

Similarly, the second detection electrode 32, the second dummy electrode 31b, the second electrode terminal 34, and the second peripheral wire 23b of the second conductive layer 11B are preferably integrally constituted and still more preferably formed of the same metal material from the viewpoints of the electric resistance and the hardness in the occurrence of disconnection. In this case, the second conductive layer 11B is formed by, for example, a lithography method.

It is noted that, in FIG. 3, a part is omitted to illustrate the substrate 24 and the metal wire 35 of the first detection electrode 30 of the first detection electrode layer 29A. The metal wire 35 illustrated in FIG. 3 is the first metal wire.

In the conductive film 18, the metal wire 35 has a width Wc of 2 μm or less, and the metal wire 35 has a height tc of 1 μm or less. The width Wc of the metal wire 35 is the length of the metal wire 35 in a direction orthogonal to the thickness direction Dt. The height tc of the metal wire 35 is the length of the metal wire 35 in the thickness direction Dt. The thickness direction Dt is a direction perpendicular to the surface 24a of the substrate 24.

The metal wire 35 has a metal layer 40, a first blackening layer 42, and a second blackening layer 44 in this order from the side of the substrate 24.

The first blackening layer 42 and the second blackening layer 44 are layers containing a metal atom and at least one selected from the group consisting of an oxygen atom and a nitrogen atom. For example, in a case where the metal atom is a copper atom, the first blackening layer 42 and the second blackening layer 44 are preferably composed of copper oxide, copper nitride, or copper oxynitride. It is noted that the metal atom is not limited to one kind and may be a plurality of kinds. For example, the metal atom is copper and nickel.

In the first blackening layer 42, a content of the metal atom at an intermediate position in the first blackening layer 42 in a thickness direction Dt is larger than a content of the metal atom at an intermediate position in the second blackening layer 44 in a thickness direction Dt.

In a case where a plurality of kinds of metal atoms are used, the content of the metal atoms is the total content of the plurality of kinds of metal atoms.

In the first blackening layer 42, the content of the metal atom in the intermediate position in the first blackening layer 42 in the thickness direction Dt is preferably 60% to 90% by atom and more preferably 70% to 85% by atom.

In the second blackening layer 44, the content of the metal atom in the intermediate position in the second blackening layer 44 in the thickness direction Dt is preferably 40% to 70% by atom and more preferably 50% to 65% by atom.

The intermediate position in the first blackening layer 42 in the thickness direction Dt is a position corresponding to half of the thickness ta of the first blackening layer 42 in the thickness direction Dt.

The intermediate position in the second blackening layer 44 in the thickness direction Dt is a position corresponding to half of the thickness tb of the second blackening layer 44 in the thickness direction Dt.

The first blackening layer 42 and the second blackening layer 44 are those for making the metal wire 35 difficult to be visible and suppressing wire visibility. Due to the first blackening layer 42 and the second blackening layer 44, the reflectivity of the metal wire 35 is reduced, the metal wire 35 is difficult to be visible, and the visibility of the metal wire 35 is improved.

The thickness ta of the first blackening layer 42 is preferably 50 to 100 nm. The thickness ta of the first blackening layer 42 is the length of the first blackening layer 42 in the thickness direction Dt.

The thickness tb of the second blackening layer 44 is preferably 10 to 50 nm. The thickness tb of the second blackening layer 44 is the length of the second blackening layer 44 in the thickness direction Dt.

In addition, it is preferable that the second blackening layer 44 is thicker than the first blackening layer 42 since the metal wire 35 is difficult to be visible.

The width Wc of the metal wire 35, the height tc of the metal wire 35, the thickness ta of the first blackening layer 42, and the thickness tb of the second blackening layer 44 are all average values. A method of measuring each of the width Wc of the metal wire 35, the height tc of the metal wire 35, the thickness ta of the first blackening layer 42, and the thickness tb of the second blackening layer 44 will be described later.

In addition, an intimate attachment layer (not illustrated in the drawing) that improves the adhesiveness between the substrate 24 and the metal layer 40 may be provided at the interface between the metal wire 35 and the substrate 24, that is, between the metal layer 40 and the surface 24a of the substrate 24. For example, in a case where the metal wire 35 is composed of copper, it is preferable that the intimate attachment layer is composed of copper oxide. In a case of providing an intimate attachment layer, it is possible to improve the adhesiveness between the metal wire 35 and the substrate 24 and stably dispose the metal wire 35 on the surface 24a of the substrate 24.

Figure 4:
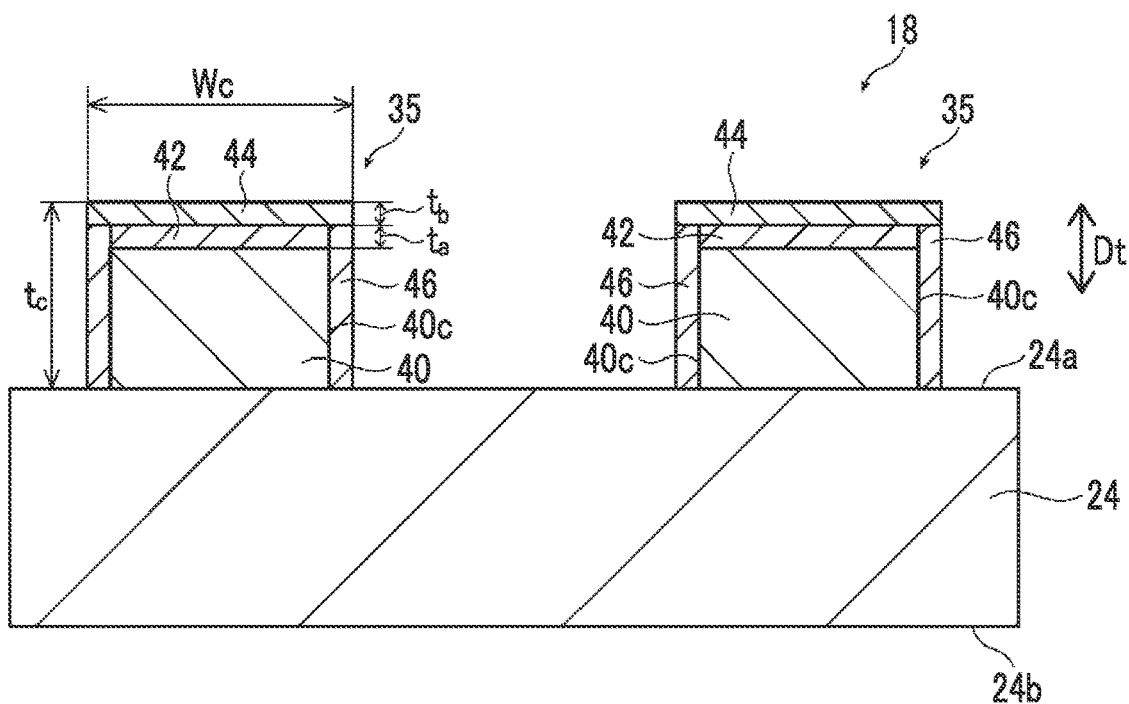
FIG. 4 is a schematic cross-sectional view illustrating a second example of the conductive film according to the embodiment of the present invention.

FIG. 4 is a schematic cross-sectional view illustrating a second example of the conductive film according to the embodiment of the present invention. It is noted that in FIG. 4, the same reference numerals are assigned to the same configuration components as those in the conductive film 18 illustrated in FIG. 3, and the detailed description thereof will be omitted.

In the conductive film 18, the metal wire 35 is not limited to the configuration illustrated in FIG. 3, and thus, for example, a configuration in which a third blackening layer 46 disposed on a side surface 40c of the metal layer 40 is further provided as illustrated in FIG. 4, may be adopted. The third blackening layer 46 is the one for making the metal wire 35 difficult to be visible and suppressing wire visibility.

Similar to the first blackening layer 42 and the second blackening layer 44, the third blackening layer 46 is a layer containing a metal atom and at least one selected from the group consisting of an oxygen atom and a nitrogen atom.

In the metal wire 35 as illustrated in FIG. 4, which has the third blackening layer 46 on the side surface 40c of the metal layer 40, in addition to the first blackening layer 42 and the second blackening layer 44, the reflectivity of the side surface 40c of the metal layer 40 is reduced, the metal wire 35 is more difficult to be visible, and the visibility of the metal wire 35 is further improved as compared with the metal wire 35 illustrated in FIG. 3.

In addition, for example, in the third blackening layer 46, the content of the metal atom at an intermediate position in the third blackening layer 46 in the thickness direction Dt is larger than the content of the metal atom at an intermediate position in the above-described second blackening layer 44 in the thickness direction Dt.

In addition, for example, the content of the metal atom in the third blackening layer 46 may be larger than that in the first blackening layer 42.

In the third blackening layer 46, the content of the metal atom in the intermediate position in the third blackening layer 46 in the thickness direction Dt is preferably 80% to 90% by atom and more preferably 80% to 85% by atom.

Although the electric resistance is small, the electric resistance of the metal wire 35 is smaller in a case where the height tc of the metal wire 35 is 1 μm or less. Therefore, the height tc of the metal wire 35 is preferably 200 to 900 nm, and more preferably 300 or more and less than 600 nm.

It is preferable that the height tc of the metal wire 35 is lower. This is due to the reason that the time of patterning the metal wire 35 having a narrower width by etching, the over-etching and the under-etching in the lateral direction are easily controlled in a case where the height of the metal wire 35 is low, that is, the thickness is thin, and the etching in the thickness direction proceeds in an instant.

In a case where the width Wc of the metal wire 35 is 2 μm or less, the metal wire 35 is difficult to be visible, and thus the visibility is excellent. In addition, in a case where the width Wc of the metal wire 35 is 2 μm or less, the moire is difficult to be visible.

It is preferable that the lower limit value of the width Wc of the metal wire 35 is smaller as long as it is within a range in which conductivity is maintained. In consideration of durability against rubbing or the like in the processing process, the width Wc of the metal wire 35 is preferably 1 μm or more.

Figure 5:
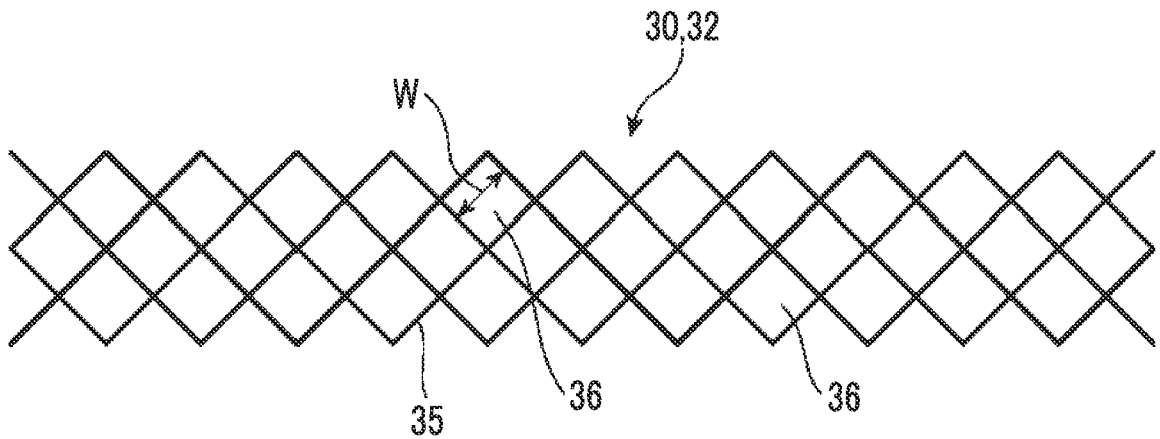
FIG. 5 is a schematic view illustrating an electrode configuration of the conductive film according to the embodiment of the present invention.

In addition, as will be described later, for example, a mesh pattern (see FIG. 5) is composed of the metal wire 35, and the metal wire 35 is disposed in a mesh patterned shape (see FIG. 5).

Here, in order to detect a touch operation by touching with or bringing a finger, a stylus pen, or the like close, a touch panel mounted on a tablet or a notebook personal computer (PC) having a size larger than that of the smartphone is required to have a lower fine wire resistance as the electric resistance of the metal wire 35.

In order not to cause a delay in an operation with a finger, a stylus pen, or the like, the fine wire resistance is preferably 80 Ω/mm or less, more preferably 60 Ω/mm or less, still more preferably 40 Ω/mm or less, and particularly preferably 30 Ω/mm or less.

The fine wire resistance of the metal wire described above is determined by measuring the electric resistance of the metal wire and standardizing (Ω/mm) it into an electric resistance in terms of a length of 1 mm. The electric resistance can be measured, for example, with a resistance meter (RM3544 manufactured by HIOKI E.E. CORPORATION).

For example, in order to narrow the frame in the periphery of the display for improving designability, the conductive film 18 is bent in a bending region Bf of the peripheral wiring part 22 illustrated in FIG. 2 with the first external connection terminal 26a and the second external connection terminal 26b being on the outside. The flexible circuit board 19 electrically connected to the first external connection terminal 26a and the second external connection terminal 26b is disposed on the side of the back surface 14b opposite to the side of the display surface 14a of the image display unit 14.

It is noted that the first peripheral wire 23a and the second peripheral wire 23b can be composed of the metal wire 35 as described later.

It is noted that the thickness of the transparent insulation layer 27 is preferably 1.0 to 5.0 μm. In a case where the thickness of the transparent insulation layer 27 is 1.0 to 5.0 μm, both insulating properties and bendability can be achieved. In addition, the thickness of the transparent insulation layer 27 is more preferably 2 to 5 μm and still more preferably 2.5 to 4.5 μm.

The thickness of the transparent insulation layer 27 is measured by cutting the conductive film 18 and using a cross-sectional image of a cut cross section of a scanning electron microscope (SEM). In the cross-sectional image, the length corresponding to the thickness of the transparent insulation layer is measured at 10 places in the image region corresponding to the transparent insulation layer, and the average value of the measured values at the 10 places is determined. The thickness of the transparent insulation layer is an average value of the measured values at the 10 places described above.

Hereinafter, each part of the conductive film and the touch panel will be described.

Substrate

The substrate supports the metal wire, and it supports the first detection electrode and the second detection electrode composed of the metal wire. In addition, the substrate supports the first peripheral wire and the second peripheral wire. In addition, in a case where the first detection electrode is disposed on one surface of both surfaces of the substrate and the second detection electrode is disposed on the other surface thereof, the substrate electrically insulates the first detection electrode and the second detection electrode from each other. For the substrate, for example, a transparent insulating substrate is used. Examples of the material of the substrate include a transparent resin material and a transparent inorganic material. The substrate preferably has a thickness of 20 to 50 μm.

The substrate is preferably a polyethylene terephthalate (PET) film from the viewpoint of cost. In a case where heat resistance is required, a polyethylene naphthalate (PEN) film or a polyimide-based film can be used. In addition to this, it is possible to use, as a substrate, a film having a thickness in a range of 20 to 50 μm, which is manufactured from a polyethylene resin, a polypropylene-based resin, a methacrylic resin, a cyclic polyolefin-based resin, a polystyrene-based resin, an acrylonitrile-(poly)styrene copolymer (an AS resin), an acrylonitrile-butadiene-styrene copolymer (an ABS resin), a polyvinyl chloride-based resin, a poly(meth) acrylic resin, a polycarbonate-based resin, a polyester-based resin, a polyamide-based resin, a polyamideimide-based resin, or the like.

The total light transmittance of the substrate is preferably 40% to 100% and more preferably 85% to 100%. The total light transmittance is measured, for example, using "Plastics—Determination of total luminous transmittance and reflectance" specified in JIS K 7375: 2008.

Metal Wire

As described above, the metal wire 35 constitutes the first detection electrode 30 (see FIG. 2) and the second detection electrode 32 (see FIG. 2). The first conductive layer 11A and the second conductive layer 11B described above consist of the metal wire. A method of forming the metal wire 35 will be described later.

Examples of the metal contained in the metal layer 40 of the metal wire 35 include a metal such as gold (Au), silver (Ag), copper (Cu), and aluminum (Al), and an alloy. Among them, from the viewpoint of the excellent conductivity of the metal wire, the metal contained in the metal layer 40 is preferably silver or copper and more preferably copper or a copper alloy. In addition, the metal layer 40 of the metal wire 35 is not limited to being composed of a metal simple substance and may have a multilayer structure of only metals, which does not include a layer of an oxide or the like.

In a case of constituting the metal layer with copper, for example, an electrolytic copper foil or rolled copper foil having a thickness of 10 to 30 μm and having a smooth surface is laminated on a substrate through an adhesive and used, or a copper layer having a thickness of about 2 μm is formed on a film by a vapor deposition method and used.

Since the line width of the copper wire formed by etching a copper foil cannot be made smaller than the thickness of the copper foil, it is necessary to determine the type of the copper foil from the desired line width. In a case where the line width is as thin as about 10 μm or less, it is preferable to use a copper thin film that has been subjected to vapor deposition on the substrate.

A conventional photolithography method is used for the patterning of the copper foil.

First, a resist is applied onto a copper foil to have a thickness of about 2 µm, and proximity exposure is carried out using a photo mask equipped with a stripe pattern constituting a mesh part, a leading-out electrode pattern, and the like. Development is carried out to form a resist pattern, and the copper foil exposed to the opening portion is removed by etching, with a ferric chloride solution at about 60° C., to form a copper wiring pattern.

In a case of forming the metal wires on both surfaces of the substrate, the above-described processing is carried out separately or simultaneously on the front surface and the back surface of the substrate since the wiring patterns do not overlap with each other.

In a case where a copper wiring pattern of a stripe pattern having the same pitch is formed in a direction orthogonal to the copper wiring pattern of the stripe pattern, it is necessary to form an insulating layer on the copper wiring pattern formed first so that the overlapping upper and lower copper wires do not short-circuit at the intersection part. In this case, a resist pattern for insulation may be formed again after peeling off the resist remaining on the copper wire used in the photolithography method for the initial copper wiring pattern, or the resist remaining on the copper wire can be used again for the insulating layer.

In a case forming the copper wiring patterns to be overlapped in the vertical direction, the countermeasure is slightly different between the negative-tone resist and the positive-tone resist pattern; however, the goal is to deform the remaining resist so that it coats the side surface of the etching-formed copper wire and is trailed. This is because there is a risk of short-circuiting or disconnection with the subsequent copper wire unless such a form is adopted. The thickness of the copper wire is preferably 2.0 µm or less. This is because in a case where the thickness is too thick, the side surface may not be coated even in a case where the resist softens and flows.

With regard to the positive-tone resist, in a case where the resist is heated to a temperature equal to or higher than the melting point, it fluidizes and drops, whereby a desired form is obtained, and at the same time, the photoreactivity disappears. Re-exposure and development may be carried out before heating to remove the resist present in a part other than the intersection part, and then the heating treatment may be carried out, whereby an unnecessary resist does not remain on the wiring line.

In a case where a negative-tone resist is used as the resist, the negative-tone resist may be cured to have a high melting point. Therefore, it is conceivable to form the initial copper wire in an insufficiently cured state. Alternatively, it is preferable that the surface of the resist on the copper foil is preferentially cured by adding an ultraviolet absorbing agent or the like so that a side etch is introduced toward the base. Although a mushroom-shaped resist pattern is formed, the resist is shaped like an eave after the etching of the copper foil, and thus the side surface can be coated without raising the temperature too much.

After forming the intersection part to have such a form, a copper wiring pattern in the orthogonal direction is formed by the photolithography method. A method of forming the second copper foil is not particularly specified; however, it is preferably a vapor deposition method. In addition, etching can be carried out on both the front surface and the back surface of the substrate at the same time, which is a desirable processing method.

First blackening layer, second blackening layer, and third blackening layer

In addition, as described above, the metal wire has the first blackening layer and the second blackening layer. Furthermore, it has the third blackening layer as well.

The first blackening layer and the second blackening layer are layers containing a metal atom and at least one selected from the group consisting of an oxygen atom and a nitrogen atom.

The third blackening layer is a layer containing a metal atom and at least one selected from the group consisting of an oxygen atom and a nitrogen atom.

The metal atom is, for example, Cu. In addition, the metal atom is not limited to one kind, may be a plurality of kinds, and may further contain, for example, Ni in addition to Cu.

Analysis Method for Metal

The contents (% by atom) of the metal atoms of the first blackening layer, the second blackening layer, and the third blackening layer can be determined by using X-ray photoelectron spectroscopy (XPS). At this time, in a case of using the etching in combination, it is possible to determine the content (% by atom) of the metal atom at different depths below the surface of the blackening layer.

For example, gas cluster ion beam XPS (GC-IB/XPS) is used as a measuring device for the contents of metal atoms in the first blackening layer, the second blackening layer, and the third blackening layer.

Device and Conditions

A device suitable as the GC-IB/XPS is a Versa Probe II XPS device (manufactured by ULVAC-PHI, Inc.) of Physical Electronics, Inc. It is preferable to use a monochromatic Al Kα X-ray source (1,486.6 eV, 15 W, 25 KV, spot size diameter of ion beam: 100 µm, raster size: 300 µm×300 µm). Low-energy electrons and Ar ions may be allowed to flow during measurement for charge compensation.

Composition Analysis in Depth Direction

In the analysis of the metal wire 35 in the depth direction, that is, in the analysis of the metal wire 35 in the thickness direction Dt, the composition analysis can be carried out while carrying out etching with an Ar gas cluster beam (5 kV, 20 nA, 2 mm×2 mm).

From this analysis, it is possible to measure the contents (% by atom) of metal atoms in the first blackening layer, the second blackening layer, and the third blackening layer, as well as the contents (% by atom) of other elements present in the blackening layers, for example, oxygen and nitrogen.

From the surface layer of the metal wire 35, the composition of the metal atom, the oxygen atom, and the nitrogen atom in the metal wire 35 in the depth direction is measured while carrying out etching. From the profile of the compositional ratio of the metal, for example, Cu and oxygen, the composition of each of the first blackening layer and the second blackening layer at the intermediate position in the thickness direction is read, and the content (% by atom) of the metal atom is obtained.

For the third blackening layer, the composition of the third blackening layer at the intermediate position in the thickness direction Dt is read, and the content (% by atom) of the metal atom is obtained.

In this way, the contents (% by atom) of metal atoms, oxygen atoms, and nitrogen atoms of the first blackening layer 42, the second blackening layer 44, and the third blackening layer are measured.

Measurement of Metal Wire

The metal wire is measured by carrying out the following conduction treatment step and cutting process and observation step.

Conduction Treatment Step

Using a vacuum vapor deposition device (IB-29510VET manufactured by JEOL Ltd.), carbon having a thickness of 10 nm is subjected to vapor deposition on the first conductive layer 11A. Subsequently, using a sputtering vapor deposition device (an E-1030 type ion sputter, manufactured by Hitachi, Ltd.), platinum is subjected to vapor deposition to have a thickness of 10 nm on the carbon having a thickness of 10 nm.

Cutting Process and Observation Step

Using an FIB function of a focused ion beam (FIB)-scanning electron microscope (SEM) composite device (Helios 600i, manufactured by Thermo Fisher Scientific, Inc.), the metal wire is subjected to cross section cutting process. As a result, the cross section of the metal wire, which has been cut along the plane orthogonal to the direction in which the metal wire extends, is exposed.

Further, using the SEM function of the FIB-SEM composite device described above, the exposed cross section is observed from the secondary electron image and the reflected electron image, and the thickness is measured.

The thicknesses of each layer of the metal wire at 10 randomly extracted places are measured in the same manner, and the average value in each layer is used as the thickness of each layer. The final thickness of each layer is determined from the cross-sectional image of the SEM and the XPS profile data, which are obtained by carrying out a measurement by the method described above. Specifically, the interface of each layer is determined from the cross-sectional observation of the SEM based on the difference in tint in each layer, and the film thickness of each layer is obtained. Since it may be difficult to specify the interface depending on the composition of the layer, XPS is used in combination. In XPS, a content (in terms of % by atom) of a specific element in the depth direction, for example, Cu or O is measured while carrying out etching from the surface, and a portion where the Cu/O ratio changes is determined to be the interface. The position determined to be the interface by XPS is compared with the position of the interface specified based on the cross-sectional image of the SEM, whereby the film thickness of each layer is determined.

In this way, the width Wc of the metal wire 35, the height tc of the metal wire 35, the thickness ta of the first blackening layer 42, and the thickness tb of the second blackening layer 44 are measured.

It is noted that in a case where the composition of the metal wire is quantified using XPS, it is difficult to measure the composition in a case where the width of the metal wire is narrow. Therefore, a pattern for composition analysis, having the same layer configuration as that of the metal wire, may be formed at the time of forming the metal wire, and the composition of the pattern for composition analysis may be measured to quantify the composition of the metal wire. As the pattern for composition analysis, for example, a fill pattern is used.

In addition, the third blackening layer 46 is a side surface layer disposed on the side surface 40c of the metal layer 40. Since it is difficult to measure the composition in a case where the thickness is small, it is also possible to expand the third blackening layer 46, using an oblique cutting method, to carry out the measurement.

Mesh Pattern

The first detection electrode 30 and the second detection electrode 32 are composed of the metal wire 35 as described above. A mesh pattern, which is formed by a plurality of the metal wires 35 intersecting with each other as illustrated in FIG. 5, is composed of, for example, the first detection electrode 30 and the second detection electrode 32.

In the first detection electrode and the second detection electrode, the mesh pattern composed of the metal wire 35 has an opening ratio of preferably 90% or more and more preferably 95% or more, from the viewpoint of visible light transmittance. The opening ratio corresponds to a transmissive portion excluding the metal wire in the region where the conductive layer is provided, that is, a proportion of the opening portion to the entire region where the conductive layer is provided.

It is noted that the first peripheral wire 23a and the second peripheral wire 23b can also have the same configuration as the first detection electrode 30 and the second detection electrode 32, and can be composed of the metal wire 35. The first peripheral wire 23a and the second peripheral wire 23b may have a mesh pattern which is formed by a plurality of the metal wires 35 intersecting with each other.

In a case where the first detection electrode 30 and the second detection electrode 32, as well as the first peripheral wire 23a and the second peripheral wire 23b, have a configuration having a mesh pattern, the pattern of the mesh pattern is not particularly limited and is preferably a geometric shape that is obtained by combining a triangle such as a regular triangle, an isosceles triangle, or a right triangle, a quadrangle such as a square, a rectangle, a rhombus, a parallelogram, or a trapezoid, a (regular) n-polygon such as a (regular) hexagon or a (regular) octagon, a circle, an ellipse, a star shape, and the like.

Figure 6:
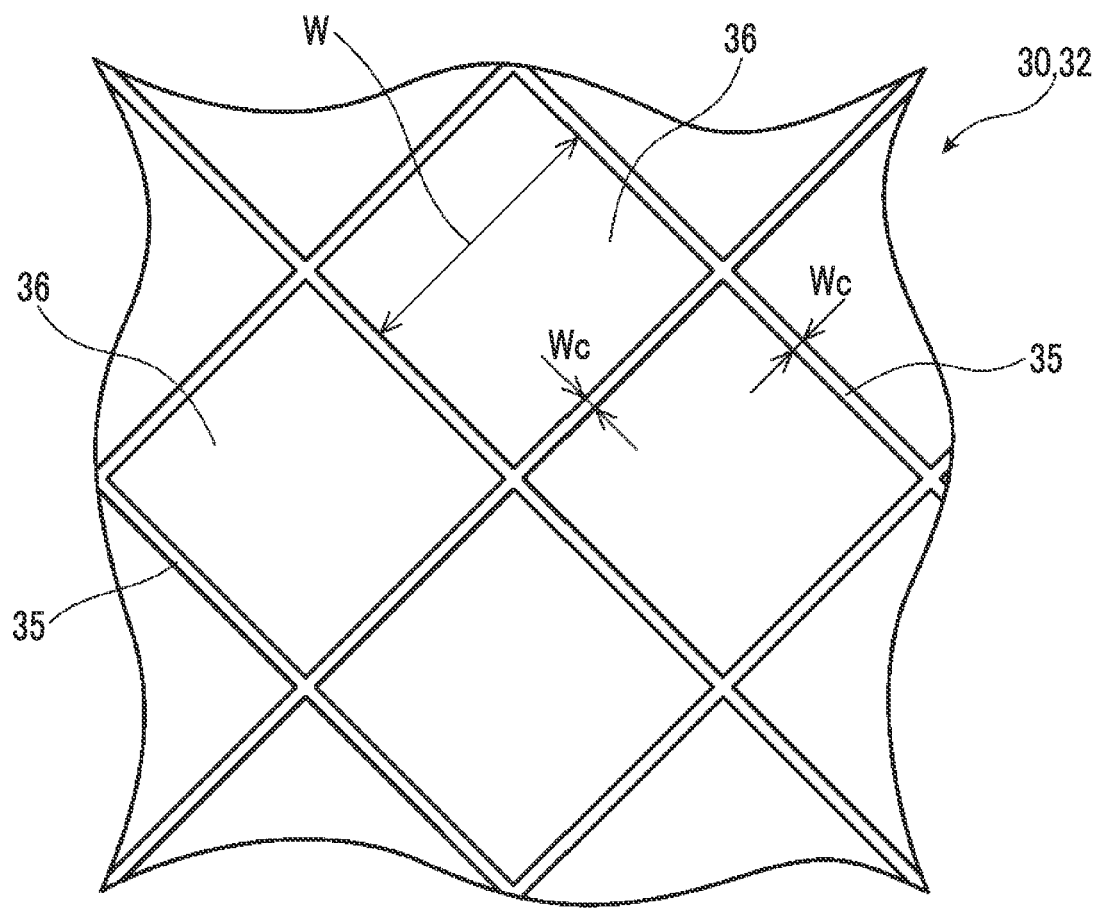
FIG. 6 is a schematic view illustrating an example of a shape of a mesh pattern of the conductive film according to the embodiment of the present invention.

As illustrated in FIG. 6, the mesh of the mesh pattern is intended to be a shape including a plurality of opening portions 36 composed of the intersecting metal wires 35. The opening portion 36 is an opening region surrounded by the metal wire 35. In FIG. 6, the opening portion 36 has a rhombus shape; however, it may have another shape. For example, the shape may be a polygonal shape (for example, a triangle, a quadrangle, a hexagon, or a random polygonal shape). Further, the shape of one side may be a curved shape or may be a circular arc shape in addition to a straight line shape. In the case of the circular arc shape, for example, two sides facing each other may have a circular arc shape protruding outward, and the other two sides facing each other may have a circular arc shape protruding inward. Further, the shape of each of the sides may be a wavy line shape in which a circular arc protruding outward and a circular arc protruding inward are continuous. Needless to say, the shape of each of the sides may be a sine curve. The mesh pattern is not particularly limited, and it may be a random pattern or a regular pattern or may be a regular mesh pattern in which a plurality of congruent shapes are repeatedly disposed.

The mesh pattern is preferably a regular mesh pattern having the same rhombic lattice. The length of one side of the rhombus, that is, the length W of one side of the opening portion 36 is preferably 50 to 1,500 μm, more preferably 150 to 800 μm, and still more preferably 200 to 600 μm, from the viewpoint of visibility. In a case where the length W of one side of the opening portion 36 is within the above-described range, good transparency can be also further maintained, and a display can be visible without a sense of discomfort, in a case where the conductive film 18 (see FIG. 1) is attached on the display surface 14a (see FIG. 1) of the image display unit 14 (see FIG. 1).

It is noted that the mesh pattern of the metal wire can be observed and measured using an optical microscope (Digital Microscope VHX-7000, manufactured by KEYENCE CORPORATION).

Second Example of Image Display Apparatus

The image display apparatus is not limited to the image display apparatus 10 illustrated in FIG. 1. Hereinafter, a second example of the image display apparatus 10 will be described.

Figure 7:
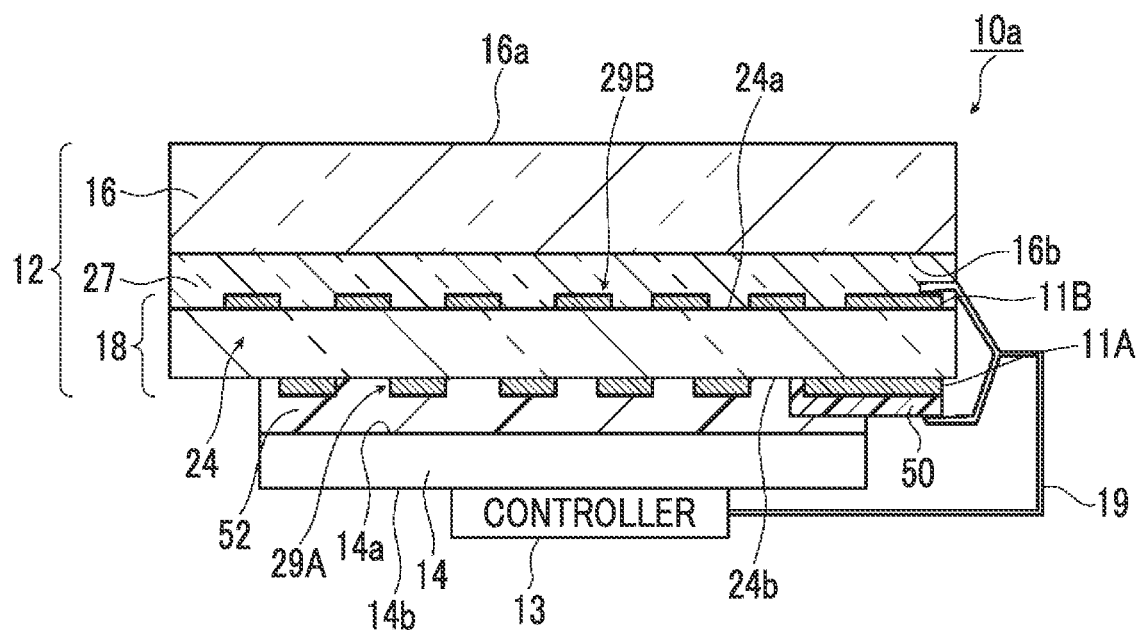
FIG. 7 is a schematic cross-sectional view illustrating a second example of an image display apparatus having a conductive film according to an embodiment of the present invention.

FIG. 7 is a schematic cross-sectional view illustrating a second example of an image display apparatus having a conductive film according to an embodiment of the present invention. It is noted that in FIG. 7, the same reference numerals are assigned to the same configuration components as those in the configuration illustrated in FIG. 1 to FIG. 3, and the detailed description thereof will be omitted.

As compared with the image display apparatus 10 illustrated in FIG. 1, the image display apparatus 10a of the second example illustrated in FIG. 7 is different in that the first detection electrode layer 29A and the second detection electrode layer 29B are provided on both surfaces of the substrate 24, respectively. The second detection electrode layer 29B is provided on the surface 24a of the substrate 24, and the first detection electrode layer 29A is provided on the back surface 24b of the substrate 24. The first detection electrode layer 29A and the second detection electrode layer 29B are electrically insulated by the substrate 24. That is, the first detection electrode 30 and the second detection electrode 32 are electrically insulated by the substrate 24.

In the image display apparatus 10a, a transparent insulation layer 52, which covers the first detection electrode layer 29A and a peripheral wire insulating layer 50 on the first peripheral wire 23a, is provided. The transparent insulation layer 27 that covers the second detection electrode layer 29B is provided on the surface 24a of the substrate 24, and the cover layer 16 is provided on the transparent insulation layer 27. The image display unit 14 is connected to the transparent insulation layer 52 with the display surface 14a being faced. The transparent insulation layer 52 has the same configuration as the transparent insulation layer 27 described above. Both the first metal wire that constitutes the first detection electrode layer 29A and the second metal wire that constitutes the second detection electrode layer 29B have the same configuration as the metal wire 35 illustrated in FIG. 3 or FIG. 4. The metal wire 35 is disposed on the surface 24a and the back surface 24b of the substrate 24 illustrated in FIG. 3 or FIG. 4. In the metal wire 35 disposed on the back surface 24b of the substrate 24, the metal layer 40, the first blackening layer 42, and the second blackening layer 44 are disposed in this order from the side of the back surface 24b of the substrate 24.

The peripheral wire insulating layer 50 is formed on the first peripheral wire 23a for the intended purpose of preventing migration and corrosion of the taking-out wiring line. As the peripheral wire insulating layer 50, for example, an organic film such as a (meth)acrylic resin or a urethane resin is used. The film thickness of the peripheral wire insulating layer 50 is preferably 1 to 30 μm.

Hereinafter, a method of forming a metal wire will be described.

Method of Forming Metal Wire

The method of forming a metal wire is not particularly limited. As the method of forming a metal wire, for example, a plating method, a printing method, or a vapor deposition method can be appropriately used.

Figure 8:
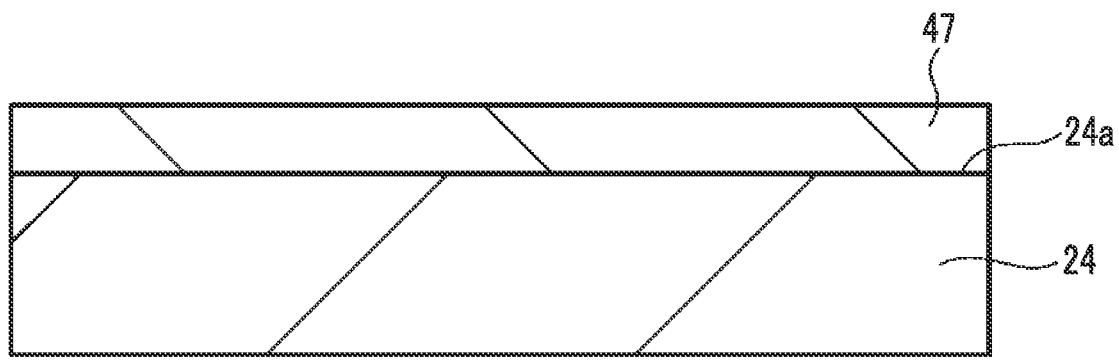
FIG. 8 is a schematic cross-sectional view illustrating one step of a manufacturing method for the first example of the conductive film according to the embodiment of the present invention.
Figure 9:
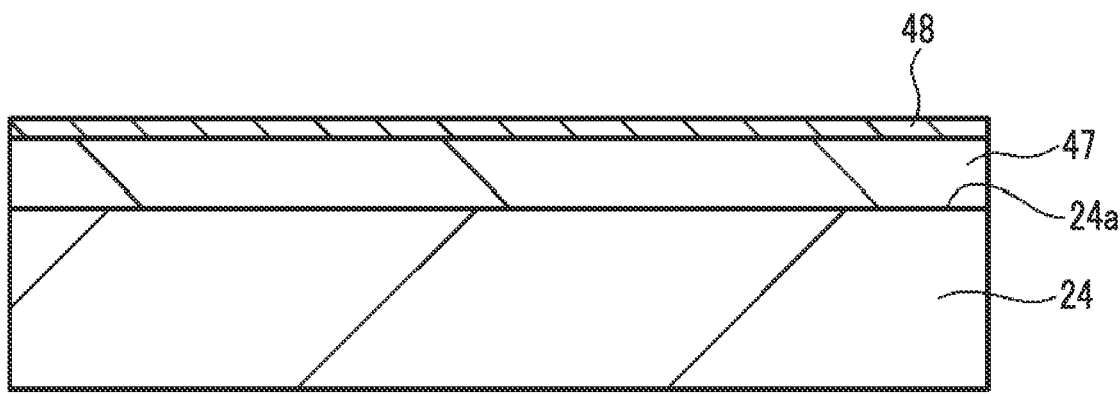
FIG. 9 is a schematic cross-sectional view illustrating one step of a manufacturing method for the first example of the conductive film according to the embodiment of the present invention.
Figure 10:
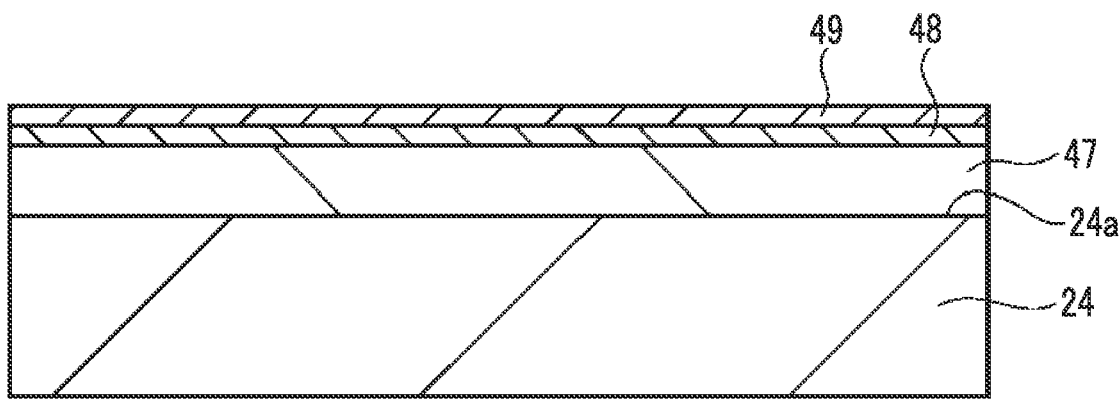
FIG. 10 is a schematic cross-sectional view illustrating one step of a manufacturing method for the first example of the conductive film according to the embodiment of the present invention.

FIGS. 8 to 10 are schematic cross-sectional views illustrating, in order of steps, steps of a manufacturing method for the first example of the conductive film according to the embodiment of the present invention.

As illustrated in FIG. 8, a metal film 47 is formed on the surface 24a of the substrate 24. The metal film 47 serves as a metal layer 40 of the metal wire 35, and it is, for example, a Cu film. The metal film 47 is formed by, for example, sputtering. The sputtering is not particularly limited, and examples thereof include reactive radio frequency (RF) sputtering.

Next, as illustrated in FIG. 9, a first blackening film 48 is formed on the metal film 47. The first blackening film 48 serves as the first blackening layer 42, and it is, for example, a $Cu_2O$ film. The $Cu_2O$ film is formed, for example, by reactive RF sputtering.

In a case of using at least one of an oxygen ($O_2$) gas or a nitrogen ($N_2$) gas as a raw material gas, for example, at the time of forming the first blackening film 48 by reactive RF sputtering, the first blackening layer 42 can be configured to contain at least one of the oxygen atom or the nitrogen atom.

In addition, in a case of using an alloy of Cu and Ni as a target, at the time of forming the first blackening film 48 by reactive RF sputtering, the first blackening layer 42 can be configured to contain Cu and Ni as metal atoms.

Next, as illustrated in FIG. 10, a second blackening film 49 is formed on the first blackening film 48. The second blackening film 49 serves as the second blackening layer 44, and it is, for example, a $Cu_2O$ film. The $Cu_2O$ film is formed, for example, by a blackening treatment or reactive RF sputtering.

The blackening treatment is a treatment in which the substrate 24 in the state illustrated in FIG. 9 is immersed in a blackening liquid for a predetermined time. It is noted that as the blackening liquid, it is possible to use, for example, an aqueous solution of 30% by weight of an oxidizing agent or about 6% by weight of caustic soda, and BO-7770V (product name, manufactured by MEC COMPANY LTD.).

In a case of using at least one of an oxygen ($O_2$) gas or a nitrogen ($N_2$) gas as a raw material gas, for example, at the time of forming the second blackening film 49 by reactive RF sputtering, the second blackening layer 44 can be configured to contain at least one of the oxygen atom or the nitrogen atom.

In addition, in a case of using an alloy of Cu and Ni as a target, at the time of forming the second blackening film 49 by reactive RF sputtering, the second blackening layer 44 can be configured to contain Cu and Ni as metal atoms.

As illustrated in FIG. 10, in a state where the metal film 47, the first blackening film 48, and the second blackening film 49 are laminated on the surface 24a of the substrate 24, the metal film 47, the first blackening film 48, and the second blackening film 49 are patterned by using a photolithography method, whereby, for example, the metal wire 35 illustrated in FIG. 3 is formed. By patterning, the metal wire 35 is formed into, for example, a mesh pattern (see FIG. 5).

In the above description, the description has been made using a case where the metal wire 35 is formed on the surface 24a of the substrate 24 as an example. However, in a case where the metal wire 35 is formed on the surface 24a and the back surface 24b of the substrate 24, the metal film 47, the first blackening film 48, and the second blackening film 49 are formed on the back surface 24b in the same manner as in the case of the surface 24a of the substrate 24. Then, in a state where the metal film 47, the first blackening film 48, and the second blackening film 49 are laminated on the surface 24a and the back surface 24b of the substrate 24, respectively, the metal film 47, the first blackening film 48, and the second blackening film 49 are patterned by using a photolithography method, whereby the metal wire 35 (see FIG. 3) is formed on the surface 24a and the back surface 24b of the substrate 24.

In addition, the metal wire 35 illustrated in FIG. 4 can be formed, for example, as follows.

Figure 11:
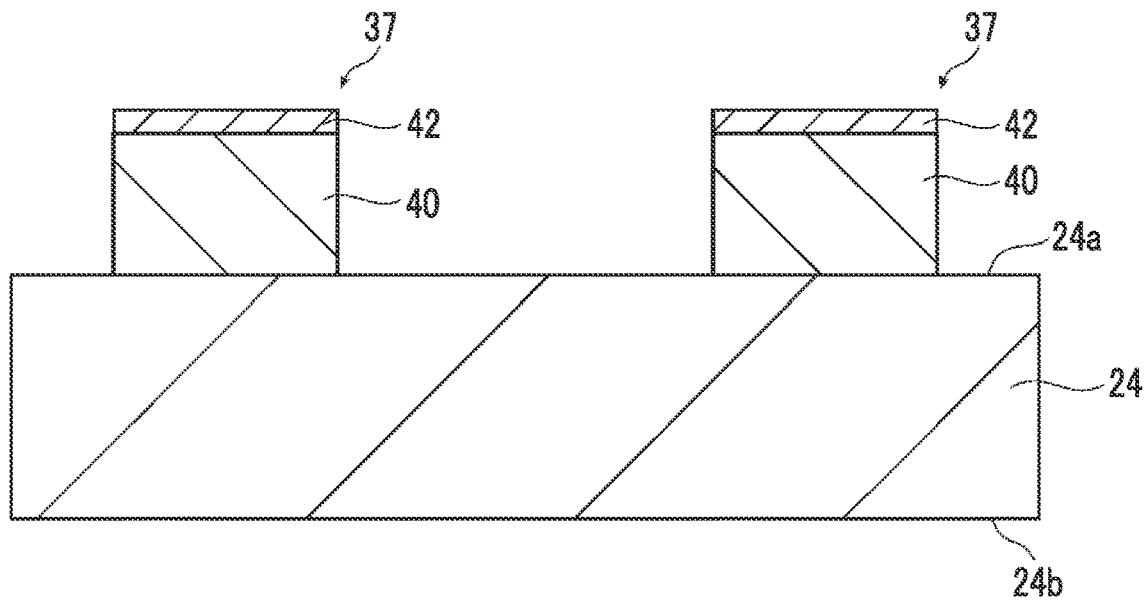
FIG. 11 is a schematic cross-sectional view illustrating one step of a manufacturing method for the second example of the conductive film according to the embodiment of the present invention.
Figure 12:
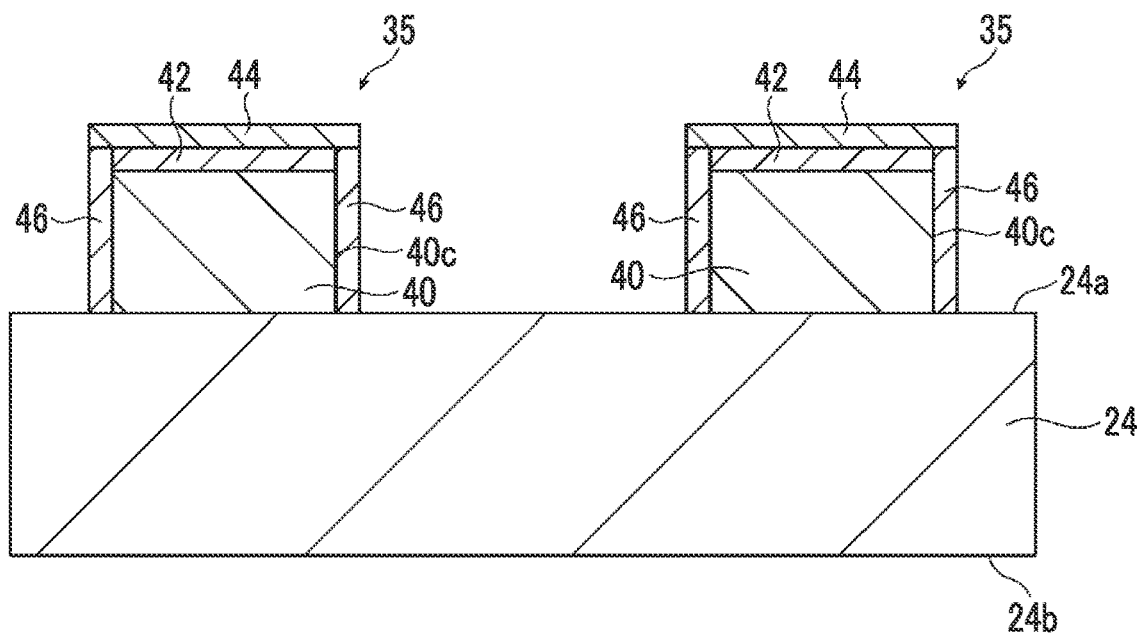
FIG. 12 is a schematic cross-sectional view illustrating one step of a manufacturing method for the second example of the conductive film according to the embodiment of the present invention.

FIGS. 11 and 12 are schematic cross-sectional views illustrating, in order of steps, steps of a manufacturing method for the second example of the conductive film according to the embodiment of the present invention. It is noted that in FIG. 11 and FIG. 12, the same reference numerals are assigned to the same configuration components as those in the conductive film 18 illustrated in FIG. 3 and FIG. 4, and the detailed description thereof will be omitted.

In the metal wire 35 illustrated in FIG. 4, the third blackening layer 46 is formed on the side surface 40c of the metal layer 40 as compared with the metal wire 35 illustrated in FIG. 3.

In the formation of the metal wire 35 illustrated in FIG. 4, in a state where the metal film 47 and the first blackening film 48 are formed on the substrate 24 as illustrated in FIG. 9, the metal film 47 and the first blackening film 48 are patterned by using a photolithography method, whereby, for example, a metal wire layer 37 illustrated in FIG. 11 is formed. By patterning, the metal wire layer 37 is formed into, for example, a mesh pattern (see FIG. 5). The metal wire layer 37 is obtained by laminating the metal layer 40 and the first blackening layer 42.

Next, as illustrated in FIG. 12, the third blackening layer 46 is formed for the metal wire layer 37 illustrated in FIG. 11. The third blackening layer 46 is formed, for example, by a blackening treatment or reactive RF sputtering. At the time of forming the third blackening layer 46, the second blackening layer 44 is also formed on the first blackening layer 42. In this way, the metal wire 35 illustrated in FIG. 4 is formed.

In the above description, the description has been made using a case where the metal wire 35 is formed on the surface 24a of the substrate 24 as an example. However, in a case where the metal wire 35 is formed on the surface 24a and the back surface 24b of the substrate 24, the metal film 47 and the first blackening film 48 are formed on the back surface 24b in the same manner as in the case of the surface 24a of the substrate 24. Then, in a state where the metal film 47 and the first blackening film 48 are laminated on the surface 24a and the back surface 24b of the substrate 24, respectively, the metal film 47 and the first blackening film 48 are patterned by using by a photolithography method, whereby the metal wire layer 37 (see FIG. 11) is formed on the surface 24a and the back surface 24b of the substrate 24. Then, the third blackening layer 46 is formed, for example, by a blackening treatment or reactive RF sputtering. In this way, the metal wire 35 (see FIG. 4) having the first blackening layer 42, the second blackening layer 44, and the third blackening layer 46 is formed on the surface 24a and the back surface 24b of the substrate 24.

It is noted that although the method of forming the metal wire 35 using sputtering has been described, the present invention is not limited thereto. A known method can be used as the method for forming the metal wire 35. Examples thereof include methods using a wet process, such as a plating method, a printing method, an application method, an inkjet method, a coating method, and a dipping method, vapor deposition methods such as a resistance heating method and an electron beam (EB) method, and methods using a dry process, such as a sputtering method and a chemical vapor deposition (CVD) method. Among the film forming methods described above, sputtering is preferably applied.

A metal wire can be formed in a desired pattern by subjecting the metal film, the first blackening film 48, and the second blackening film 49 to etching processing by using a photolithography method.

Next, a method of forming a metal wire by a plating method will be described. The metal film 47 can be formed on a substrate, for example, by a plating method. In this case, after a catalyst ink containing at least metal fine particles is formed on a base material, the base material is immersed in an electroless plating bath to form a metal plating film as the metal film. More specifically, the method of manufacturing a metal-coated base material described in JP2014-159620A can be used. In addition, after forming a resin composition having at least a functional group capable of interacting with a metal catalyst precursor, into a patterned shape on a base material, a catalyst or a catalyst precursor is applied, and the base material is immersed in an electroless plating bath to form a metal plating film as the metal film. More specifically, the method of manufacturing a metal-coated base material described in JP2012-144761A can be applied. The patterned shape includes a mesh pattern.

As the plating method, only electroless plating may be carried out, or electrolytic plating may be carried out after electroless plating. An additive method can be used in the plating method.

The additive method is a method of forming a metal wire by subjecting only a portion of the transparent substrate on which the metal wire is desired to be formed, to the plating treatment or the like. From the viewpoint of productivity and the like, the additive method is preferable.

A subtractive method can also be used for forming the metal wire. The subtractive method is a method of forming a conductive layer on a transparent substrate and removing unnecessary portions by, for example, an etching treatment such as a chemical etching treatment to form a metal wire.

A method of forming a metal wire by a printing method will be described. For example, the metal film 47 can be formed on the substrate by a printing method. In this case, the metal film can be formed by first coating a substrate with a conductive paste containing a conductive powder and then subjecting the coated substrate to a heating treatment. More specifically, as a conductive paste, the conductive paste described in JP2011-28985A can be used.

A method of forming a metal wire by a vapor deposition method will be described. For example, the metal film 47 can be formed on a substrate by a vapor deposition method. In this case, first, a metal film such as copper is formed by vapor deposition. As the metal film, an electrolytic copper foil can be used in addition to the metal film obtained by vapor deposition. More specifically, the step of forming a copper wire described in JP2014-29614A can be used.

The photolithography method is a method in which the metal film, the first blackening film 48, and the second blackening film 49 are processed into a desired pattern by going through each of steps of resist coating, formation of resist film, exposure of resist film, development and rinsing, etching of metal film, first blackening film 48, and second blackening film 49, and peeling of resist film. A general photolithography method known in the related art can be appropriately used. For example, as the resist, any one of a positive-tone or resist negative-tone resist can be used. In addition, after the application of the resist, preheating or prebaking can be carried out as necessary. At the time of the exposure, a pattern mask having a desired pattern is disposed and irradiated from above with light having a wavelength suitable for the resist used, generally with ultraviolet rays. After the exposure, development can be carried out with a developer suitable for the resist used. After the development, the resist pattern is formed by stopping the development with a rinsing liquid such as water and carrying out washing. The resist pattern is, for example, a pattern corresponding to the mesh pattern.

Next, the formed resist pattern is subjected to pretreatment or post-baking, as necessary, and then subjected to etching to form a pattern corresponding to the resist pattern, on the metal film, the first blackening film 48, and the second blackening film 49. As the etchant, an etchant that can be used as an etchant for copper, such as a ferric chloride aqueous solution, can be appropriately selected. After etching, the residual resist film is peeled off to obtain a metal wire having a desired pattern. The photolithography method is a method generally recognized by those skilled in the art, and a specific application aspect thereof can be easily selected by those skilled in the art according to an intended purpose.

Transparent Insulation Layer

The transparent insulation layer 27 is a layer that coats the upper side of the first metal wire, and it is transparent and has electrical insulating properties. The transparent insulation layer 27 is different from the first transparent insulation layer 15 and the second transparent insulation layer 17 described above.

The transparent insulation layer 27 is not particularly limited as long as it is possible to maintain the electrical insulating properties without the metal wires 35 being conducted with each other at the time of the use of the conductive film 18, where the metal wires 35 are originally electrically insulated. The transparent insulation layer 27 is formed from, for example, an inorganic substance such as silicon dioxide, silicon nitride, silicon oxynitride, or aluminum oxide. In addition, the transparent insulation layer 27 is formed from, for example, an organic substance such as a (meth)acrylic resin, a urethane resin, or a polyimide resin. From the viewpoint of ease of formation and ease of control of film thickness, the transparent insulation layer 27 is preferably an organic substance and particularly preferably a (meth)acrylic resin.

In order to form the transparent insulation layer, it is preferable to use a composition for forming a transparent insulation layer as described later.

A component contained in the composition for forming a transparent insulation layer is not particularly limited; however, a monomer is preferably contained. The monomer is preferably a polymerizable compound having a (meth)acryloyl group, and it is more preferably a polyfunctional polymerizable compound having a (meth)acryloyl group (a polymerizable compound having two or more (meth)acryloyl groups).

The composition for forming a transparent insulation layer may contain a polymerization initiator and a solvent in addition to the above-described monomer.

The content of the monomer in the composition for forming a transparent insulation layer is not particularly limited; however, it is preferably 40% to 95% by mass with respect to the total amount of the components excluding the solvent in the composition for forming a transparent insulation layer.

The content of the polymerization initiator in the composition for forming a transparent insulation layer is not particularly limited; however, it is preferably 0.1% to 10% by mass with respect to the total amount of the components excluding the solvent in the composition for forming a transparent insulation layer.

Method of Manufacturing Conductive Film

Hereinafter, a method of manufacturing the conductive film 18 will be described.

It has a first step of forming the first metal wire on a substrate and a second step of forming a transparent insulation layer that coats the first metal wire.

For example, a PET substrate is used as the substrate.

The first step is a step of forming the first metal wire on the surface 24a of the substrate 24. However, since the first metal wire is formed by the above-described method of forming a metal wire, the detailed description thereof will be omitted. It is noted that in order to form the mesh pattern (see FIG. 5) with the metal wire 35, the second step preferably includes a step of forming the first metal wire to have a mesh patterned shape (see FIG. 5). Since the step of forming a mesh pattern is also the same as the above-described method of forming a metal wire, the detailed description thereof will be omitted.

The first detection electrode 30 (see FIG. 2) is formed from the first metal wire. The first detection electrode 30 (see FIG. 2) is formed on the surface 24a of the substrate 24.

The second step is a step of forming the transparent insulation layer 27 that coats the first metal wire. For the transparent insulation layer 27, for example, a (meth)acrylic resin is used. As described above, the thickness of the transparent insulation layer 27 is preferably 1.0 to 5.0 µm.

The method for forming the transparent insulation layer 27 is not particularly limited. Examples thereof include a method of forming a transparent insulation layer (a coating method) and a method of forming a transparent insulation layer on a temporary substrate and transferring the transparent insulation layer onto the surface 24a of the substrate 24 so that the metal wire is coated (a transfer method).

The second step is preferably a step of applying a composition for forming a transparent insulation layer onto the first metal wire to form the transparent insulation layer 27. That is, it is preferable to use a coating method from the viewpoint that the thickness of the transparent insulation layer 27 can be easily controlled.

The coating method for carrying out coating with a composition for forming a transparent insulation layer is not particularly limited, and it is possible to use a known method, for example, a coating method using a gravure coater, a comma coater, a bar coater, a knife coater, a die coater, a roll coater, or the like, an inkjet method, or a screen printing method.

It is noted that after the coating, a curing treatment may be carried out as necessary. Examples of the curing treatment include a photocuring treatment and a heating treatment.

It is noted that depending on the configuration of the conductive film, a third step of further forming the second metal wire on the transparent insulation layer 27 may be provided.

Since the second metal wire of the third step is formed by the above-described method of forming a metal wire, the detailed description thereof will be omitted. It is noted that in order to form the mesh pattern (see FIG. 5) with the metal wire 35, the second metal wire may be formed to have a mesh patterned shape (see FIG. 5) in the third step as well. The second detection electrode 32 (see FIG. 2) is formed from the second metal wire. The second detection electrode is formed on the transparent insulation layer 27. In addition, in the third step, the second peripheral wire 23b that is electrically connected to the second detection electrode 32 is also formed from the second metal wire.

The second transparent insulation layer 17 may be formed on the second detection electrode 32 and the second peripheral wire 23b. For the second transparent insulation layer 17, for example, an optical clear adhesive (OCA) is used, and the second transparent insulation layer 17 has flexibility. It is noted that a shield electrode may be provided on the second transparent insulation layer 17.

The present invention is basically constituted as described above. As described above, the conductive film according to the embodiment of the present invention has been described in detail; however, the present invention is not limited to the above-described embodiments, and, needless to say, various improvements or modifications may be made without departing from the gist of the present invention.

EXAMPLES

Hereinafter, the characteristics of the present invention will be described more specifically with reference to Examples. The materials, the reagents, the amounts and ratios of substances, the operations, and the like described in the following Examples can be appropriately modified as long as they do not depart from the gist of the present invention. As a result, the scope of the present invention is not limited to the following Examples.

Hereinafter, conductive films of Examples 1 to 6 and Comparative Example 1 will be described.

Example 1

The conductive film of Example 1 will be described.

First, as a substrate, a PET substrate having a thickness of 50 μm (COSMOSHINE (registered trade name) A4300, manufactured by TOYOBO Co., Ltd.) was prepared.

Next, a copper film was formed on the substrate using reactive RF sputtering as follows. Copper was used as a target, and film formation was carried out under the conditions of a film forming chamber pressure of 0.4 Pa, a power density of 4.2 W/cm$^2$, and a temperature during film formation of 90° C. while introducing an argon (Ar) gas (flow rate: 270 sccm (456.3×10$^{-3}$ Pa·m$^3$/sec)) into a sputtering device as a raw material gas. The film thickness of the obtained copper film was 500 nm. This copper film serves as a metal layer.

Next, a Cu$_2$O film having a thickness of 50 nm was formed on the copper film formed on the substrate, by using reactive RF sputtering as follows. Copper was used as a target, and Ar gas and oxygen (O$_2$) gas were used as the raw material gas. The Cu$_2$O film serves as the first blackening layer.

Subsequently, a resist film was bonded onto the Cu$_2$O film, and the wiring pattern was exposed using a mask. In addition, the resist in the uncured portion of the resist film was removed. Then, the laminated film of the copper film and the Cu$_2$O film was etched to form a metal wiring pattern. An etchant H-1000A (model number, a ferric chloride solution) manufactured by Sunhayato Corp. was used for etching.

After forming the metal wiring pattern, the substrate was immersed in a blackening liquid to form a CuO layer on the surface of the Cu$_2$O film so that the thickness of the CuO layer was 30 nm. This CuO layer is the second blackening layer. It is noted that the thickness of the CuO layer was controlled with the immersion time, the concentration of the blackening liquid, and the temperature of the blackening liquid. At the same time, a Cu$_2$O layer, which is the third blackening layer, is formed on the side surface of the copper film. In this way, a metal wire having the first blackening layer, the second blackening layer, and the third blackening layer was formed.

It is noted that for the blackening treatment, BO-7770V (product name, manufactured by MEC COMPANY LTD.) was used as the blackening liquid.

Example 2

Example 2 was the same as Example 1, except that it was different in that the time of the blackening treatment was lengthened as compared with Example 1, and the blackening treatment was carried out so that the thickness of the CuO layer on the outermost surface, that is, the thickness of the second blackening layer was 40 nm.

Example 3

Example 3 was the same as Example 1, except that it was different in that a CuON film having a thickness of 50 nm was formed on the copper film on the substrate as compared with Example 1. In Example 3, the first blackening layer was composed of the CuON layer.

The CuON layer was formed using reactive RF sputtering. Cu was used as the target, and Ar gas, nitrogen (N$_2$) gas, and O$_2$ gas were used as the raw material gas.

Example 4

Example 4 was the same Example 1, except that it was different in that a CuNiO film having a thickness of 50 nm was formed on the copper film on the substrate as compared with Example 1. In Example 4, the first blackening layer was composed of the CuON layer.

The CuNiO layer was formed using reactive RF sputtering. A CuNi alloy was used as a target, and Ar gas and O$_2$ gas were used as the raw material gas.

Example 5

In Example 5, as compared with Example 1, a blackening treatment was carried out after forming the copper film and the CuO film on the substrate and before forming the metal wiring pattern, and the Cu$_2$O film was formed on the CuO film. Thereafter, Example 5 was the same as Example 1, except that a metal wiring pattern was formed. Example 5 has a configuration in which the copper film, that is, the side surface of the metal layer does not have the third blackening layer.

Example 6

Example 6 was the same as Example 1, except that it was different in that the time of the blackening treatment was shortened as compared with Example 1, and the blackening treatment was carried out so that the thickness of the CuO layer on the outermost surface, that is, the thickness of the second blackening layer was 20 nm.

Comparative Example 1

Comparative Example 1 was the same Example 1 except that it was different in that the second blackening layer and the third blackening layer were not present as compared with Example 1.

In Comparative Example 1, a copper film having a thickness of 500 nm was formed in the same manner as in Example 1, and a $Cu_2O$ layer having a thickness of 50 nm was formed on the copper film.

Quantitation of Metal Compositional Ratio of Metal Wire

Although the composition of the metal wire is quantified using XPS, it is difficult to measure the composition in a case where the width of the metal wire is narrow. Therefore, a fill pattern of 5 mm×5 mm was formed in advance on a substrate as a pattern for composition analysis. In order to quantify the metal composition of the metal wire, the composition of the pattern for composition analysis was measured.

Since it is difficult to measure the composition of the side surface layer, which is the third blackening layer, in a case where the thickness is small, it is also possible to expand the side surface layer, using an oblique cutting method, to carry out the measurement.

The composition of the metal wire 35 in the depth direction was measured while carrying out etching from the surface of the metal wire with a gas cluster ion beam (GC ion beam-IB).

The CuO layer (corresponding to the second blackening layer), the $Cu_2O$ layer (corresponding to the first blackening layer), and the Cu layer (corresponding to the metal layer) are observed in this order from the surface layer. A boundary of each layer was determined from the change in composition, and a composition at an intermediate position in the thickness direction was adopted as a composition of each of the CuO layer, the $Cu_2O$ layer, and the Cu layer.

Analysis Method for Content (% of Atom) of Metal Atom

The content (% of atom) of the metal atom in the blackening layer can be determined by using X-ray photoelectron spectroscopy (XPS). At this time, the content (% by atom) of the metal atom at different depths below the surface of the blackening layer was determined by using the etching in combination.

For example, gas cluster ion beam XPS (GC-IB/XPS) was used as a measuring device for the content of the metal atom in the blackening layer.

Device and Conditions

A device suitable as the GC-IB/XPS is a Versa Probe II XPS device (manufactured by ULVAC-PHI, Inc.) of Physical Electronics, Inc. It is preferable to use a monochromatic Al Kα X-ray source (1,486.6 eV, 15 W, 25 KV, spot size diameter of ion beam: 100 μm, raster size: 300 μm×300 μm). Low-energy electrons and Ar ions may be allowed to flow during measurement for charge compensation.

Composition Analysis in Depth Direction

In the analysis of the metal wire 35 in the depth direction, that is, in the analysis in the thickness direction Dt, the composition analysis was carried out while carrying out etching with an Ar gas cluster beam (5 kV, 20 nA, 2 mm×2 mm).

From this analysis, the contents (% by atom) of metal atoms in the first blackening layer, the second blackening layer, and the third blackening layer were measured, and other elements present in the first blackening layer, the second blackening layer, and the third blackening layer, for example, oxygen and nitrogen were measured.

From the surface layer, the composition of the metal atom, the oxygen atom, and the nitrogen atom in the metal wire 35 in the depth direction is measured while carrying out etching. From the profile of the compositional ratio of the metal, for example, Cu and oxygen, the composition of each of the first blackening layer and the second blackening layer at the intermediate position in the thickness direction was read and used as the content (% by atom) of the metal atom.

For the third blackening layer, the composition at the intermediate position in the thickness direction Dt was read and used as the content (% by atom) of the metal atom.

Measurement of Metal Wire

The metal wire was measured by carrying out the following conduction treatment step and cutting process and observation step.

Conduction Treatment Step

Using a vacuum vapor deposition device (IB-29510VET manufactured by JEOL Ltd.), carbon having a thickness of 10 nm was subjected to vapor deposition on the first conductive layer 11A. Subsequently, using a sputtering vapor deposition device (an E-1030 type ion sputter, manufactured by Hitachi, Ltd.), platinum (Pt) was subjected to vapor deposition to have a thickness of 10 nm on the carbon having a thickness of 10 nm.

Cutting Process and Observation Step

Using an FIB function of a focused ion beam (FIB)-scanning electron microscope (SEM) composite device (Helios 600i, manufactured by Thermo Fisher Scientific, Inc.), a CVD film (thickness: 500 nm) of Pt as a surface protective film was formed, and then the metal wire was subjected to cross section cutting process under the condition of a $Ga^+$ acceleration voltage of 30 kV. As a result, the cross section of the metal wire, which had been cut along the plane orthogonal to the direction in which the metal wire extended, was exposed.

Further, by using the SEM function of the FIB-SEM composite device described above, the exposed cross section was observed with a secondary electron image and a reflected electron image under the conditions of an acceleration voltage of 1 kV, a probe current of 86 pA, and a working distance (W. D.) of 4 mm, and the thickness was measured. It is noted that the above-described "W. D." is a distance between the objective lens of the SEM and the cross section of the sample, in this case, the metal wire.

The thicknesses of each layer of the metal wire at 10 randomly extracted places were measured in the same manner, and the average value in each layer is used as the thickness of each layer. The final thickness of each layer was determined from the cross-sectional image of the SEM and the XPS profile data, which were measured by the methods described above. Specifically, the interface of each layer was determined from the cross-sectional observation of the SEM based on the difference in tint in the Cu layer, the $Cu_2O$ layer, and the CuO layer, and the film thickness of each of the Cu layer, the $Cu_2O$ layer, and the CuO layer is determined. Since it was difficult to specify the interface between the $Cu_2O$ layer and the CuO layer, XPS was used in combination. In XPS, contents (in terms of % by atom) of Cu and O in the depth direction were measured while carrying out etching from the surface, and a portion where the Cu/O ratio changed was determined to be the interface. The position determined to be the interface by XPS was compared with the position of the interface specified based on the cross-sectional image of the SEM, whereby the film thickness of each layer was determined.

In present Example, the wiring line resistance and visibility of the conductive films of Examples 1 to 6 and Comparative Example 1 were evaluated. The evaluation results of the wiring line resistance and the visibility are shown in Table 1 below. Hereinafter, the wiring line resistance and the visibility will be described.

Wiring Line Resistance

Regarding the wiring line resistance, after forming the metal wire, the electric resistance of the metal wire was measured and standardized (Ω/mm) into an electric resistance in terms of a length of 1 mm. This was carried out on 10 metal wires, and an average value from the 10 metal wires was used as a wiring line resistance. The electric resistance of the metal wire was measured using a resistance meter (RM3544, manufactured by HIOKI E.E. CORPORATION).

Visibility

In each of the conductive films of Examples 1 to 6 and Comparative Example 1, glass was bonded onto the side of the wiring line surface through an optical clear adhesive (OCA). Black paper was bonded onto the opposite surface on the side opposite to the wiring line surface of the substrate through OCA to prepare a sample of each of Examples 1 to 6 and Comparative Example 1, the sample being for evaluation of visibility. The sample was observed under a fluorescent lamp while changing the angle from the side of the glass surface. The visibility was determined by twenty evaluators. The observation results from the twenty evaluators were evaluated based on the following evaluation standards to evaluate the visibility.

Evaluation Standards

"A": None of the twenty persons can recognize the fine metal wire.

"B": Among the twenty persons, 1 or more and 4 or less persons could recognize the fine metal wire.

"C": Among the twenty persons, 5 or more and less than 10 persons could recognize the fine metal wire.

"D": Among the twenty persons, 10 or more persons could recognize the fine metal wire.

It is noted that an evaluation "D" is a level at which there is a problem in practical use, an evaluation "C" or higher is a level at which there is no problem in practical use, an evaluation "B" is an excellent level, and an evaluation "A" is a very excellent level.

In Comparative Example 1, no second blackening layer was provided, and thus the metal wire was visible, and the visibility was poor.

From the comparison between Examples 1 to 6, it was found that the line is more difficult to be visible and the visibility is better in a case where the third blackening layer is present. In addition, it was found that the second blackening layer is difficult to be visible and the visibility is good in a case of being thicker than the first blackening layer.

EXPLANATION OF REFERENCES 10, 10a: image display apparatus
11A: first conductive layer
11B: second conductive layer
12: touch panel
13: controller
14: image display unit
14a: display surface
14b: back surface
15: first transparent insulation layer
16: cover layer
16a: surface
16b: back surface
17: second transparent insulation layer
18: conductive film
19: flexible circuit board
20: detection unit
22: peripheral wiring part
23a: first peripheral wire
23b: second peripheral wire
24: substrate
24a: surface
24b: back surface
26a: first external connection terminal
26b: second external connection terminal
27: transparent insulation layer

TABLE 1

| | Metal wire | | First blackening layer | | | | Second blackening layer | |
|---|---|---|---|---|---|---|---|---|
| | Width (μm) | Height (nm) | Thickness (μm) | Kind | Content (% by atom) | Kind of non-metal | Thickness (μm) | Metal atom Kind |
| Example 1 | 1.7 | 500 | 20 | Cu | 75 | O | 30 | Cu |
| Example 2 | 1.7 | 500 | 10 | Cu | 75 | O | 40 | Cu |
| Example 3 | 1.7 | 500 | 20 | Cu | 75 | O, N | 30 | Cu |
| Example 4 | 1.7 | 500 | 20 | Cu—Ni | 80 | O | 30 | Cu—Ni |
| Example 5 | 1.7 | 500 | 20 | Cu | 75 | — | 30 | Cu |
| Example 6 | 1.7 | 300 | 30 | Cu | 75 | O | 20 | Cu |
| Comparative Example 1 | 1.7 | 500 | 30 | Cu | 75 | — | — | — |

| | Second blackening layer | | Third blackening layer | | | | Evaluation | |
|---|---|---|---|---|---|---|---|---|
| | Content (% by atom) | Kind of non-metal | Kind | Content (% by atom) | Kind of non-metal | | Wiring line resistance (Ω/mm) | Visibility |
| Example 1 | 55 | O | Cu | 80 | O | | 22 | B |
| Example 2 | 55 | O | Cu | 80 | O | | 22 | A |
| Example 3 | 55 | O, N | Cu | 80 | O, N | | 22 | B |
| Example 4 | 65 | O | Cu—Ni | 85 | O | | 22 | B |
| Example 5 | 55 | O | — | — | — | | 18 | C |
| Example 6 | 55 | O | Cu | 80 | O | | 22 | C |
| Comparative Example 1 | — | — | — | — | — | | 18 | D |

As shown in Table 1, Examples 1 to 6 had good visibility as compared with Comparative Example 1.

27a: surface
29A: first detection electrode layer
29B: second detection electrode layer
30: first detection electrode
31a: first dummy electrode
31b: second dummy electrode
32: second detection electrode
33: first electrode terminal
34: second electrode terminal
35: metal wire
36: opening portion
37: metal wire layer
40: metal layer
40c: side surface
42: first blackening layer
44: second blackening layer
46: third blackening layer
47: metal film
48: first blackening film
49: second blackening film
50: peripheral wire insulating layer
52: transparent insulation layer
Bf: bending region
Dt: thickness direction
$E_1$: detection region
$E_2$: peripheral region
ta, tb: thickness
tc: height

What is claimed is:

1. A conductive film comprising:
a substrate; and
a conductive layer that is disposed on the substrate and consists of a metal wire,
wherein a width of the metal wire is 2 μm or less, and a height of the metal wire is 1 μm or less,
the metal wire has a metal layer, a first blackening layer, and a second blackening layer in this order from a side of the substrate,
the first blackening layer and the second blackening layer are layers containing a metal atom and at least one selected from the group consisting of an oxygen atom and a nitrogen atom, and
in the first blackening layer, a content of the metal atom at an intermediate position in the first blackening layer in a thickness direction is larger than a content of the metal atom at an intermediate position in the second blackening layer in a thickness direction.

2. The conductive film according to claim 1, further comprising:
a third blackening layer that is disposed on a side surface of the metal layer,
wherein the third blackening layer is a layer containing a metal atom and at least one selected from the group consisting of an oxygen atom and a nitrogen atom.

3. The conductive film according to claim 2,
wherein a thickness of the second blackening layer is larger than a thickness of the first blackening layer.

4. The conductive film according to claim 3,
wherein a thickness of the second blackening layer is 10 to 50 nm.

5. The conductive film according to claim 4,
wherein the metal atom includes Cu.

6. The conductive film according to claim 3,
wherein the metal atom includes Cu.

7. The conductive film according to claim 2,
wherein a thickness of the second blackening layer is 10 to 50 nm.

8. The conductive film according to claim 7,
wherein the metal atom includes Cu.

9. The conductive film according to claim 2,
wherein the metal atom includes Cu.

10. The conductive film according to claim 1,
wherein a thickness of the second blackening layer is larger than a thickness of the first blackening layer.

11. The conductive film according to claim 10,
wherein a thickness of the second blackening layer is 10 to 50 nm.

12. The conductive film according to claim 11,
wherein the metal atom includes Cu.

13. The conductive film according to claim 10,
wherein the metal atom includes Cu.

14. The conductive film according to claim 1,
wherein a thickness of the second blackening layer is 10 to 50 nm.

15. The conductive film according to claim 14,
wherein the metal atom includes Cu.

16. The conductive film according to claim 1,
wherein the metal atom includes Cu.

* * * * *